(12) United States Patent
Rotge

(10) Patent No.: US 9,900,024 B2
(45) Date of Patent: Feb. 20, 2018

(54) METHOD AND SYSTEM FOR CODING INFORMATION

(71) Applicant: PARALLEL GEOMETRY INC., Outremont (CA)

(72) Inventor: Jean-Francois Rotge, Quebec (CA)

(73) Assignee: PARALLEL GEOMETRY INC., Outremont, Quebec (CA)

( * ) Notice: Subject to any disclaimer, the term of this patent is extended or adjusted under 35 U.S.C. 154(b) by 399 days.

(21) Appl. No.: 14/357,468

(22) PCT Filed: Nov. 13, 2012

(86) PCT No.: PCT/CA2012/001042
§ 371 (c)(1),
(2) Date: Jul. 23, 2015

(87) PCT Pub. No.: WO2013/067629
PCT Pub. Date: May 16, 2013

(65) Prior Publication Data
US 2015/0318865 A1    Nov. 5, 2015

(30) Foreign Application Priority Data

Nov. 10, 2011    (CA) ..................................... 2758243

(51) Int. Cl.
*G06F 7/32* (2006.01)
*H03M 7/30* (2006.01)
*G06F 17/16* (2006.01)

(52) U.S. Cl.
CPC .............. *H03M 7/30* (2013.01); *G06F 17/16* (2013.01)

(58) Field of Classification Search
CPC .................................. H03M 7/30; G06F 17/16

USPC ........................................................ 708/520
See application file for complete search history.

(56) References Cited

U.S. PATENT DOCUMENTS 5,392,036 A * 2/1995 Klein ....................... H03M 7/30
341/51

FOREIGN PATENT DOCUMENTS

WO    WO2006110002 A1    10/2006

OTHER PUBLICATIONS

Craig, John W. "Multidimensional Trellis Coding for MPSK," Military Communications Conference, 1990. MILCOM '90, Conference Record, a New Era. 1990 IEEE, vol., No., pp. 369-374, vol. 1, Sep. 30-Oct. 3, 1990.
International Search Report for International Application No. PCT/CA2012/001042, dated Mar. 6, 2013.

* cited by examiner

*Primary Examiner* — Tan V. Mai
(74) *Attorney, Agent, or Firm* — Pearl Cohen Zedek Latzer Baratz LLP

(57) ABSTRACT

A method and an apparatus are described for coding information, the method comprising obtaining a list of integers to be encoded; determining a hyper-pyramid having a dimension adapted to encode the list of integers, the hyper-pyramid having a plurality of vertices whose number is determined by the degree of the hyper-pyramid, which is equal to the sum of the integers of the list of integers and by the dimension of the hyper-pyramid which is equal to the number of integers of the list of integers minus one; indexing the list of integers in the hyper-pyramid using an indexing system; and providing an indication of the indexing of the list of integers in the hyper-pyramid.

18 Claims, 54 Drawing Sheets

Cantor order and boustrophedon Cantor order

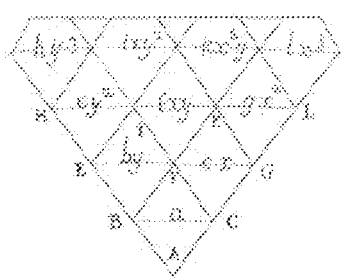 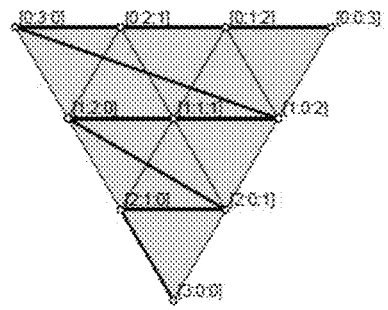
FIG. 2A: Original Triangle   FIG. 2B: Malves' Zig Zag
De Gua de Malves' triangle and its projective extension

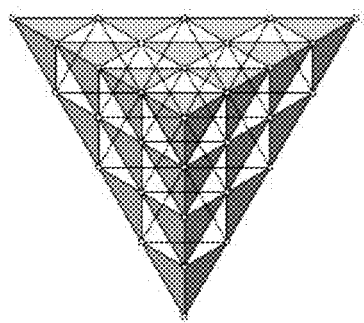 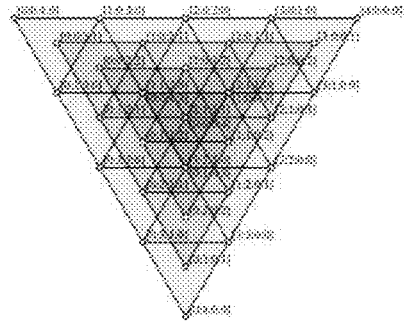
FIG. 3A: $T_{4,3}$ lattice      FIG. 3B: Coordinates
Pyramidal lattice and projective coordinates labeling

```
                              > LOCAL:=proc(x)
                              > local acc,i,j,ind;
                              > acc:=0;
                              > i:=0;
                              > j:=0;
                              > while x >= acc do
> GLOBAL:=proc(v2)            >   acc:=2^i;
> local m,n,i,acc,ind;        >   i:=i+1;
> m:=v2[1];                   > end do;
> n:=v2[2];                   > ind:=x-2^(i-2);
> acc:=0;                     > acc:=0;
> ind:=2^(m+n)-1;             > while ind >= acc do
> for i from 0 to m-1 do      >   acc:=acc+Comb(j,i-2-j);
>   acc:=acc+Comb(i,m+n-i);   >   j:=j+1;
> end do;                     > end do;
> ind+acc+1;                  > [j-1,i-j-1];
> end proc:                   > end proc:
```

FIGURE 5: Global index coding and decoding

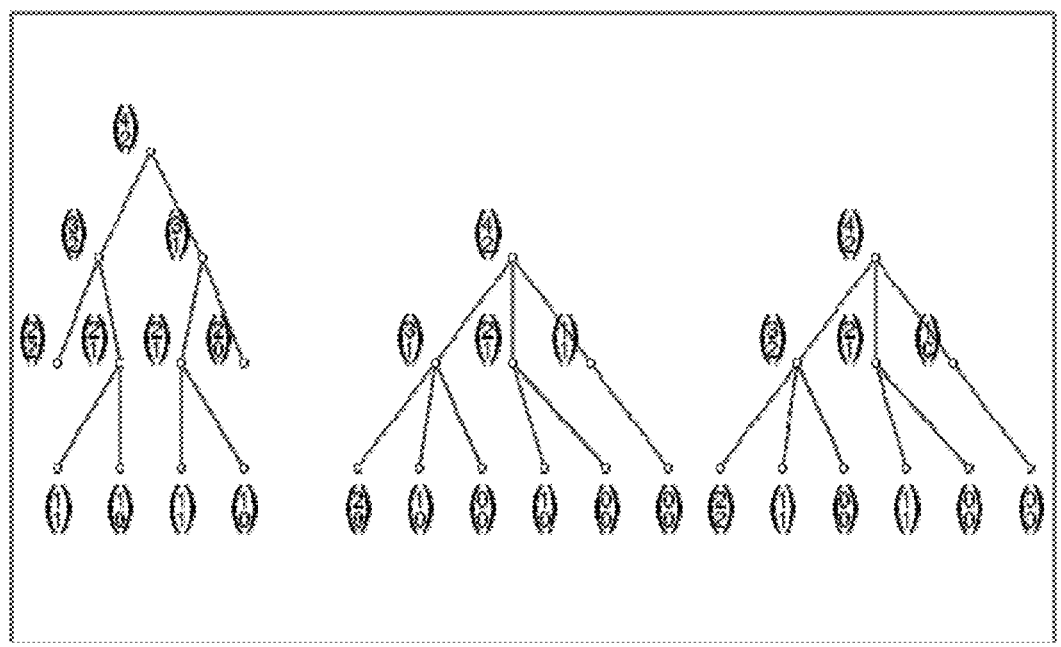
FIGURE 6: Recursive trees for $\binom{4}{2}$

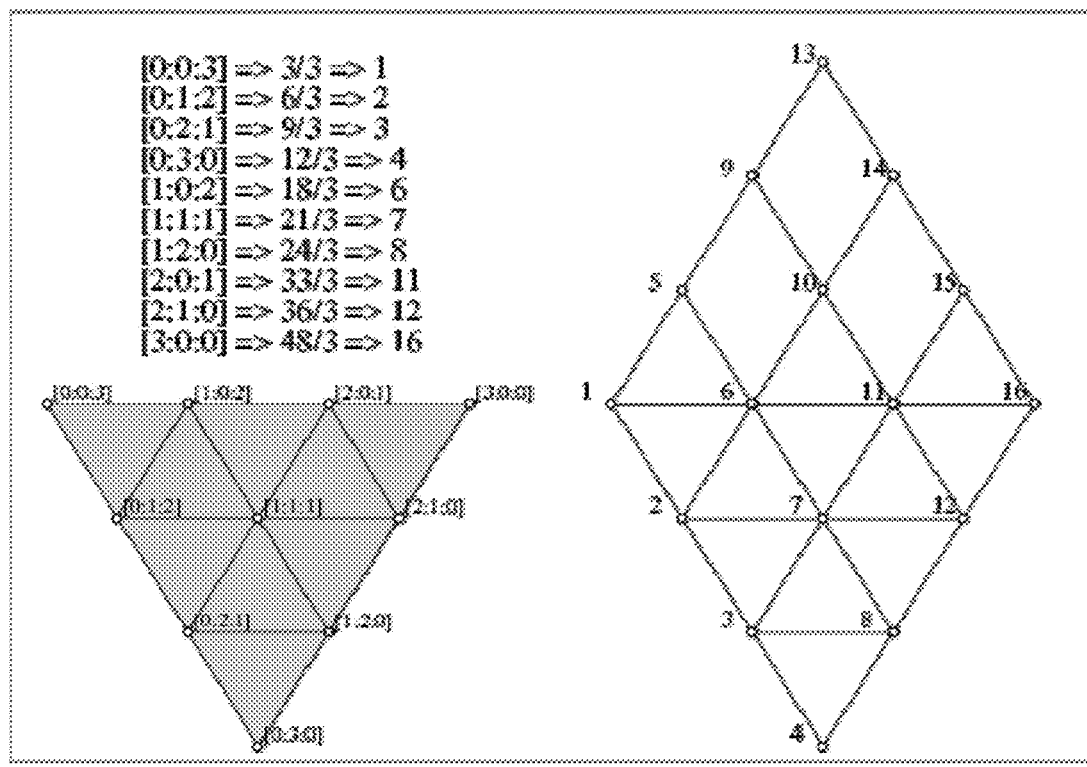
FIGURE 7: Positional indexing for $T_{3,2}$ in quaternary base

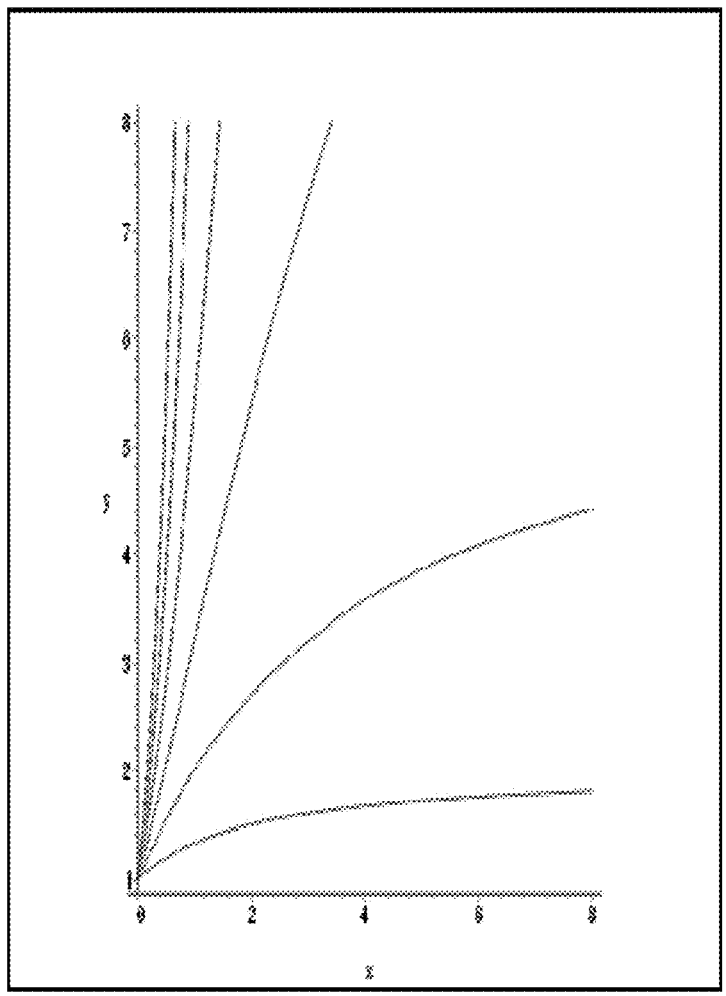
FIGURE 8: Large integers' expansion

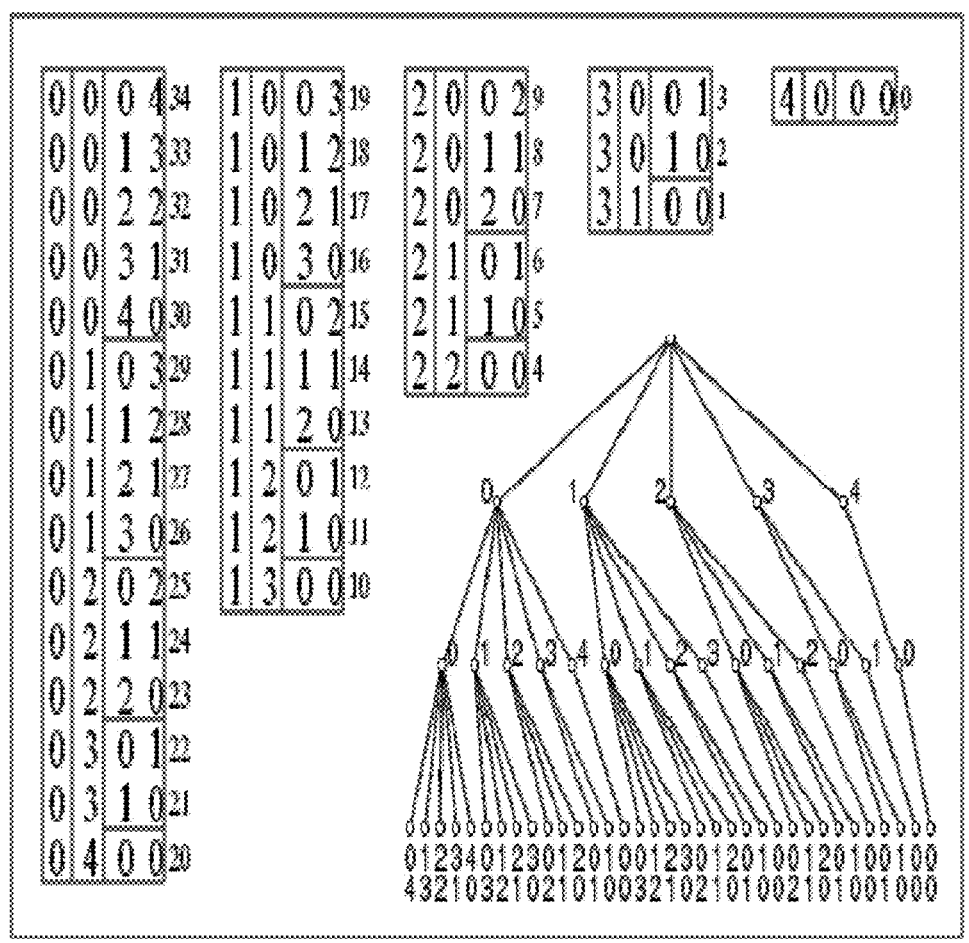
FIGURE 9: Numeric order for $T_{4,3}$ lattice

```
> NUMORD:=proc(vn,n)
> local i,j,k,m,acci,accj,d;
> m:=0;
> d:=n;
> for k from 1 to d+1 do
>   m:=m+vn[k];
> end do;
1 acci:=0;
2 m:=m-1;
3 for i from 1 to n do
4   m:=m-vn[i];
5   acci:=acci+Comb(m,d-i+1);
6 end do;
> acci;
> end proc:
```

FIGURE 10: Numeric order encoding

| $i$ | $acc_i$ | $m$ | $d-i+1$ | $Comb(m, d-i+1)$ |
|---|---|---|---|---|
| 1 | 126 | 4 | 5 | $\binom{9}{5} = 126$ |
| 2 | 196 | 4 | 4 | $\binom{8}{4} = 70$ |
| 3 | 206 | 2 | 3 | $\binom{5}{3} = 10$ |
| 4 | 209 | 1 | 2 | $\binom{3}{2} = 3$ |
| 5 | 210 | 0 | 1 | $\binom{1}{1} = 1$ |

|   | 0 | 1 | 2 | 3 | 4 | 5 | 6 | 7 | 8 | 9 |
|---|---|---|---|---|---|---|---|---|---|---|
| 0 | 1 | | | | | | | | | |
| 1 | 1 | 1 | | | | | | | | |
| 2 | 1 | 2 | 1 | | | | | | | |
| 3 | 1 | 3 | 3 | 1 | | | | | | |
| 4 | 1 | 4 | 6 | 4 | 1 | | | | | |
| 5 | 1 | 5 | 10 | 10 | 5 | 1 | | | | |
| 6 | 1 | 6 | 15 | 20 | 15 | 6 | 1 | | | |
| 7 | 1 | 7 | 21 | 35 | 35 | 21 | 7 | 1 | | |
| 8 | 1 | 8 | 28 | 56 | 70 | 56 | 28 | 8 | 1 | |
| 9 | 1 | 9 | 36 | 84 | 126 | 126 | 84 | 36 | 9 | 1 |

FIGURE 11: Binomial number composition

```
> ORDNUM:=proc(v3)
> local ind,m,n,d,i,x,v2;
> ind:=v3[1];
> m:=v3[2];
> n:=v3[3];
> d:=n;
> for i from 1 to d+1 do      > ORINUM:=proc(ind,m,n)
>   x[i]:=0;                   > local j,t0,t1,exp;
> end do;                      > t1:=0;
> for i from 1 to d do         > for j from 0 to m do
>   v2:=ORINUM(ind,m,n);       >   t0:=t1;
>   x[i]:=v2[1];               >   t1:=Cm(j,n);
>   ind:=v2[2];                >   if t1 > ind then
>   m:=m-x[i];                 >     exp:=m-j;
>   n:=n-1;                    >     j:=m;
> end do;                      >   end if;
> x[d+1]:=m;                   > end do;
> convert(x,array);            > [exp,ind-t0];
> end proc:                    > end proc:
```

FIGURE 12: Numeric order decoding

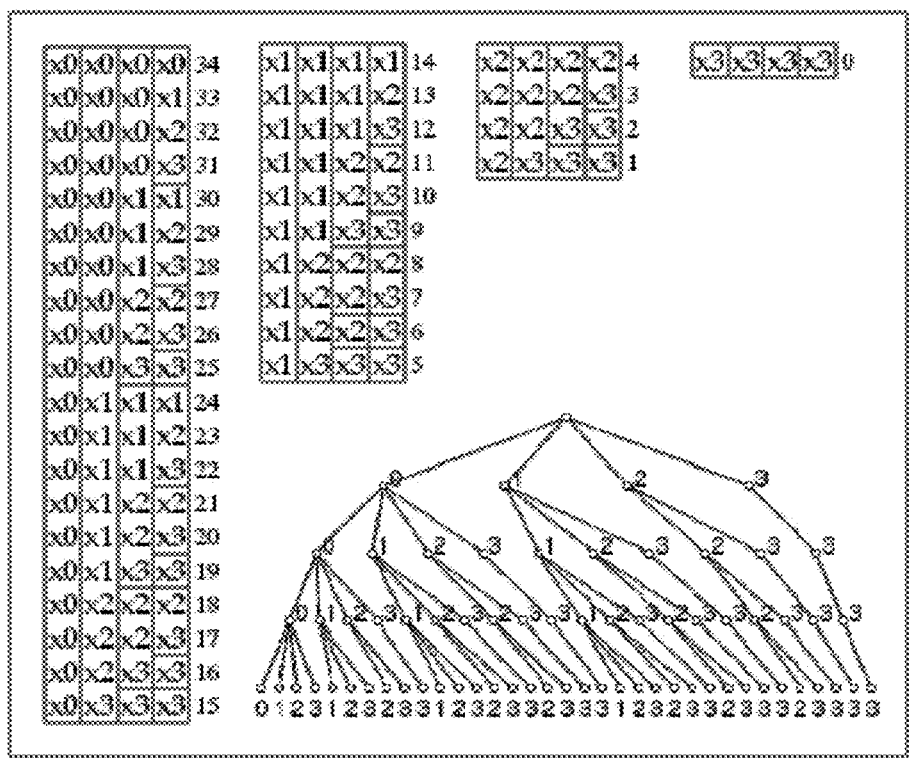
Figure 13 $T_{4,3}$ lattice lexicographic encoding

```
> LEXORD:=proc(vm,m,n)
> local i,acci,d;
> acci:=0;
> d:=n-1;
> for i from 0 to m-1 do
>   acci:=acci+Comb(m-i,d-vm[i+1]);
> end do;
> acci;
> end proc:
```

FIGURE 14: Lexicographic order encoding

```
> ORDLEX:=proc(v3)
> local ind,i,m,n,x,v2,d,bloc;
> ind:=v3[1];
> m:=v3[2];
> n:=v3[3];
> d:=n+1;
> for i from 1 to m do x[i]:=0; end do;
> for i from 1 to m do
>    v2:=ORILEX([ind,m,n]);
>    bloc:=v2[1];
>    ind:=v2[2];
>    x[i]:=d-bloc;
>    m:=m-1;
>    n:=bloc-1;
> end do;
> convert(x,array);
> end proc:
```

```
> ORILEX:=proc(v3)
> local ind,m,n,i,acc,acci,v2;
> ind:=v3[1];
> m:=v3[2];
> n:=v3[3];
> acci:=0;
> for i from 0 to n do
>    acc:=acci;
>    acci:=Comb(m,i);
>    if ind < acci then
>       v2:=[i+1,ind-acc];
>       i:=n;
>    end if;
> end do;
> v2;
> end proc:
```

FIGURE 15: Lexicographic decoding

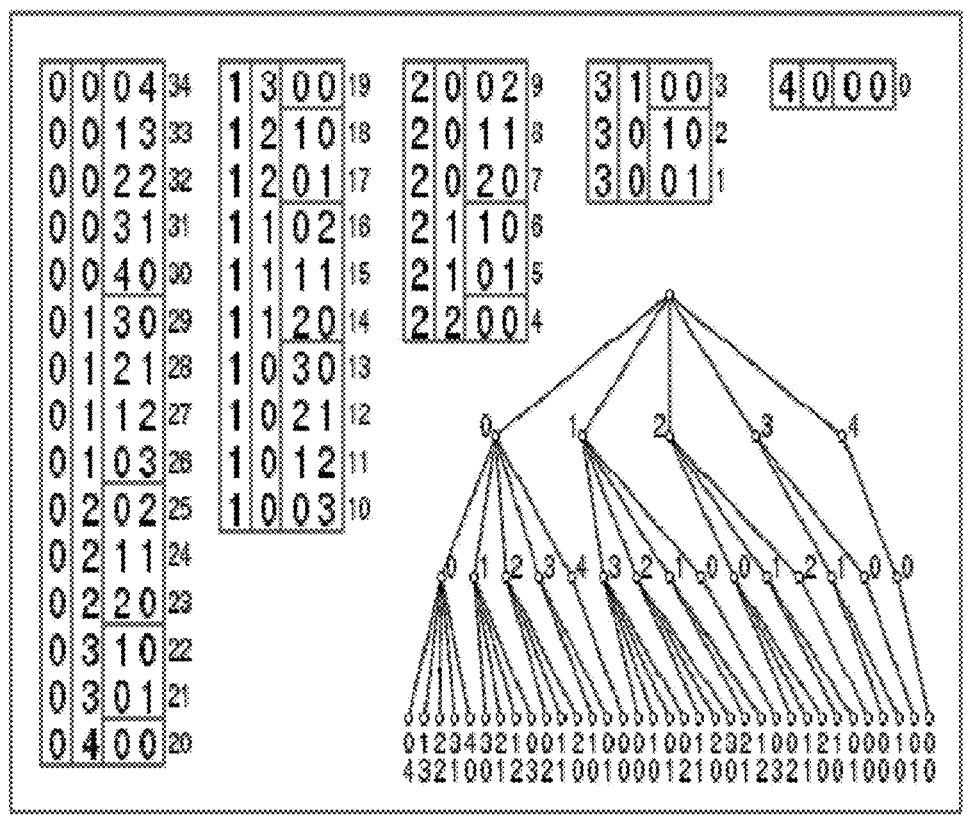
FIGURE 16: Projective Grey Encoding (4,3)

```
>  GRAORD:=proc(vn,d)
>  local i,j,k,m,acci,accj,n,accv,par,s;
>  m:=0;
>  n:=d;
>  s:=1;
>  for k from 1 to d+1 do
>     m:=m+vn[k];
>  end do;
>  acci:=0;
>  m:=m-1;
>  for i from 1 to n do
>     m:=m-vn[i];
>     n:=d-i;
>     accj:=Comb(m,n+1);
1    if (i=1)
2      then acci:=acci+accj;
3      else
4        par:=type(vn[i-1],even);
5        if par
6          then acci:=acci+s*accj;
7          else acci:=acci+s*(accv-1-accj);
8             s:=-1*s;
9        end if;
10     end if;
>     accv:=Comb(m+1,n);
>  end do;
>  acci;
>  end proc:
```

FIGURE 17: Projective Gray encoding

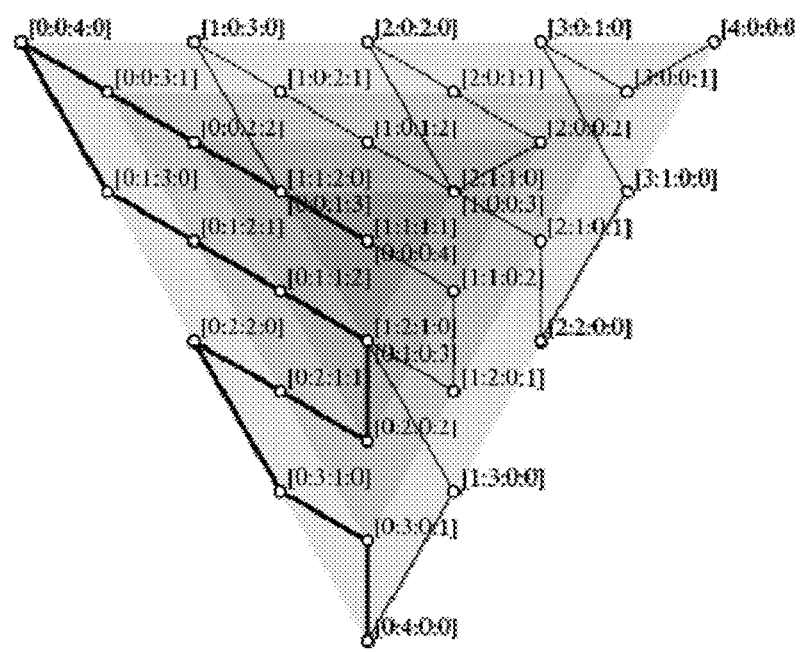
FIGURE 18: Gray projective $T_{4,3}$ path

```
> ORDGRA:=proc(v3)                          > ORIGRA:=proc(ind,m,n)
> local ind,m,n,d,i,x,v2;                   > local j,t0,t1,exp,p;
> ind:=v3[1];                               > p:=ind;
> m:=v3[2];                                 > if type(m,odd)
> n:=v3[3];                                 >   then p:=Comb(m,n)-ind-1;
> d:=n;                                     > end if;
> for i from 1 to d+1 do                    > t1:=0;
>   x[i]:=0;                                > for j from 0 to m do
> end do;                                   >   t0:=t1;
> for i from 1 to d do                      >   t1:=Comb(j,n);
>   v2:=ORIGRA(ind,m,n);                    >   if t1 > p then
>   x[i]:=v2[1];                            >     exp:=m-j;
>   ind:=v2[2];                             >     j:=m;
>   m:=m-x[i];                              >   end if;
>   n:=n-1;                                 > end do;
> end do;                                   > if type(m,odd)
> x[d+1]:=m;                                >   then [exp,Comb(m-exp,n-1)-(p-t0)-1];
> convert(x,array);                         >   else [exp,p-t0];
> end proc;                                 > end if
                                            > end proc;
```

FIGURE 19: Projective Gray decoding

```
> VM2VN:=proc(vn,m,n)
> local i,j,acc,vm,exp,res;
> for i from 1 to m do
>   vm[i]:=0;
> end do;
> acc:=0;
> for i from 0 to n do
>   for j from 1 to vn[n+1-i] do
>     acc:=acc+1;
>     vm[acc]:=i;
>   end do;
> end do;
> convert(vm,array);
> end proc:
```

```
> VM2VN:=proc(vm,m,n)
> local i,j,acc,vn,coo;
> for i from 1 to n+1 do
>   vn[i]:=0;
> end do;
> acc:=0;
> for i from 1 to m do
>   coo:=vm[i];
>   vn[n-coo+1]:=vn[n-coo+1]+1;
> end do;
> convert(vn,array);
> end proc:
```

FIGURE 20: Vector to vector transcoding

FIG. 21A: Generic tree
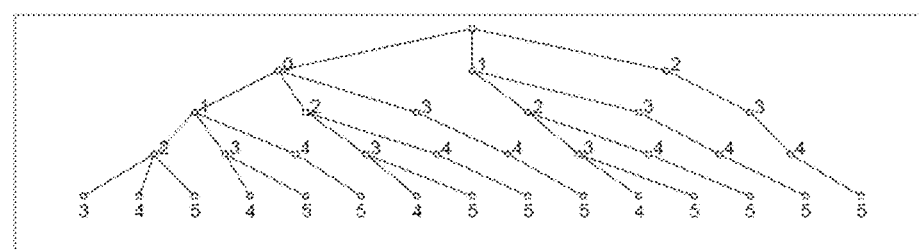
FIG. 21B: Combinations tree
Generic and combinatorial tree $\binom{6}{4}$

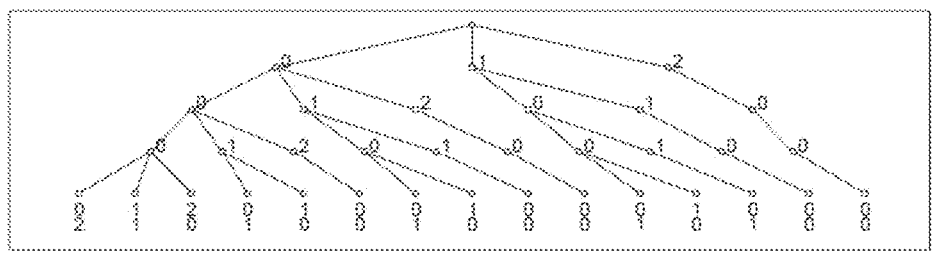
FIGURE 22: $\binom{6}{4}$ tree and Numeric labels

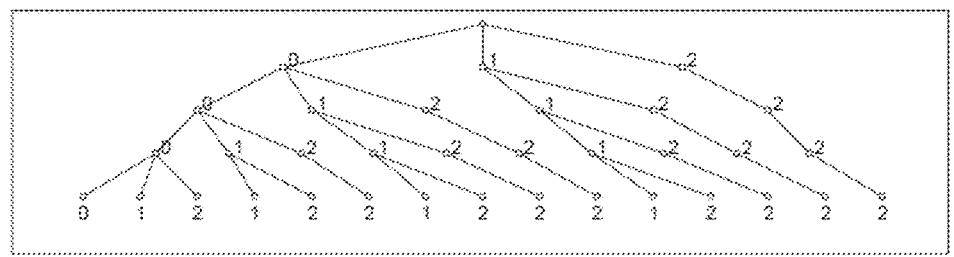
FIGURE 23: $\binom{6}{4}$ tree and lexicographic labels

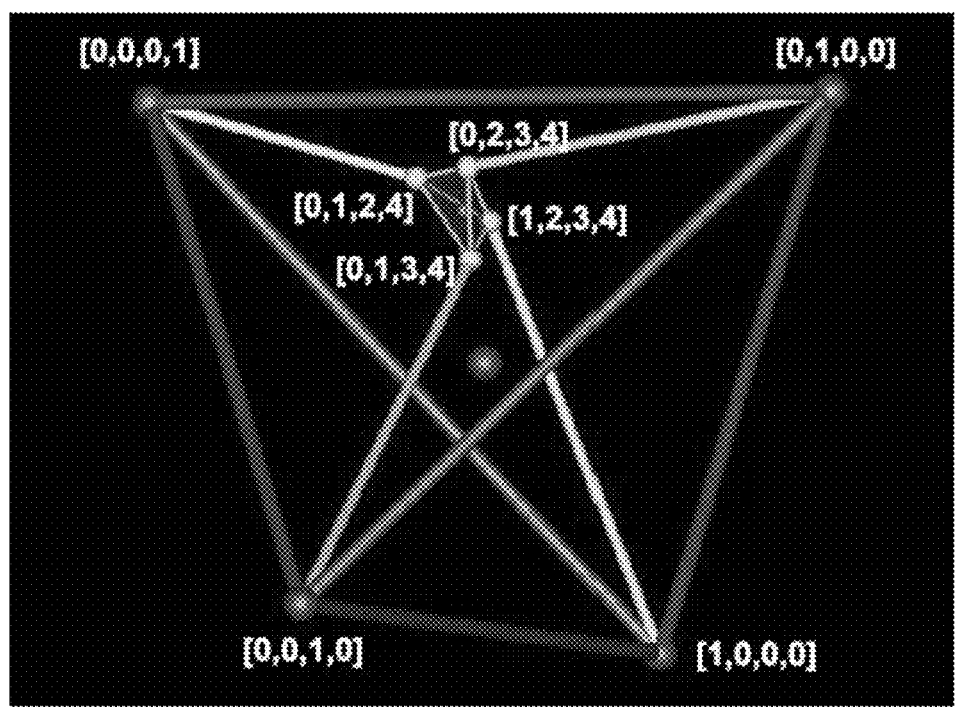
FIGURE 24: Combinatorial projective sub-space

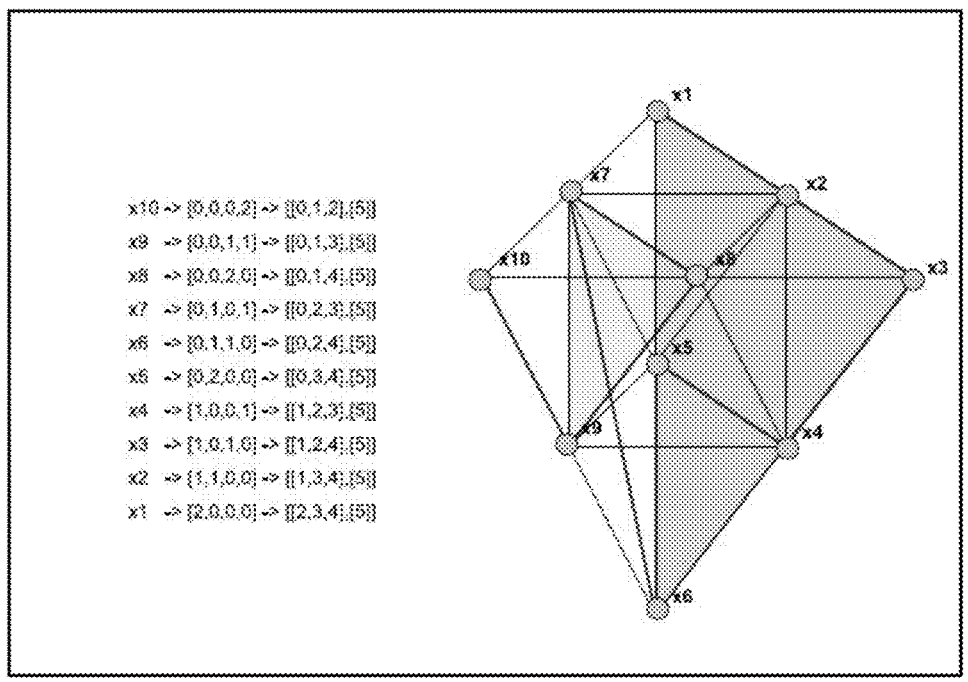
FIGURE 25: Projective points to combinations bijection

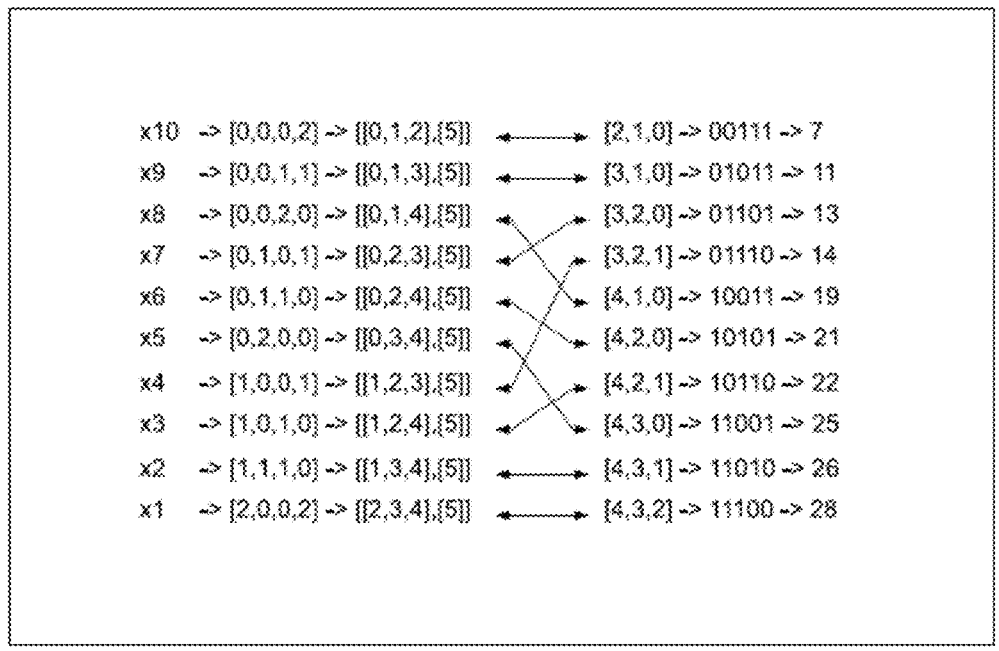
FIGURE 26: Projective and binary combinations generation

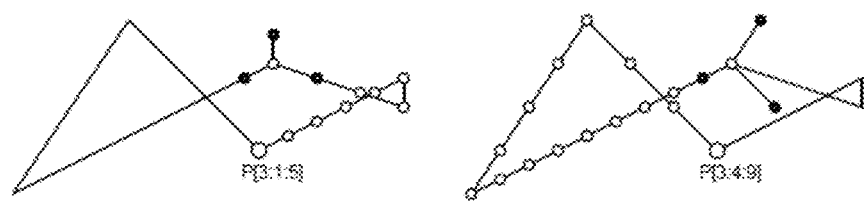
FIGURE 27: Euclidian and affine coordinates for a Cantor point

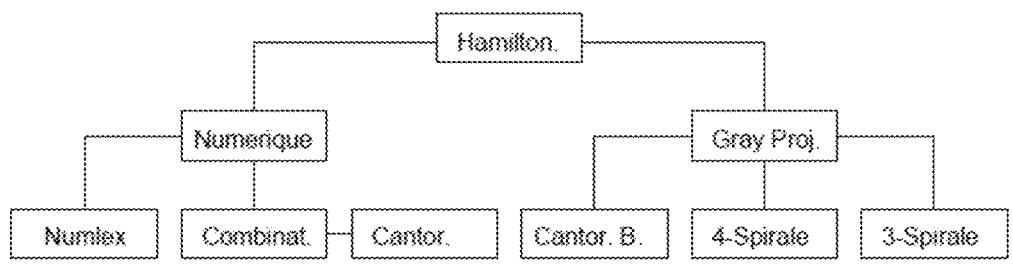
FIGURE 28: Orders taxonomy

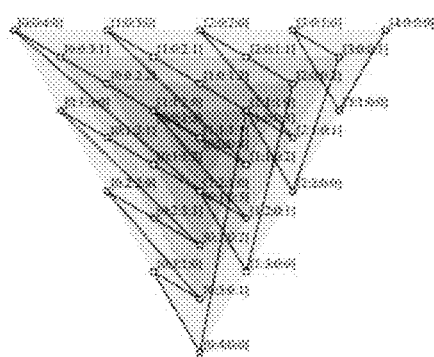 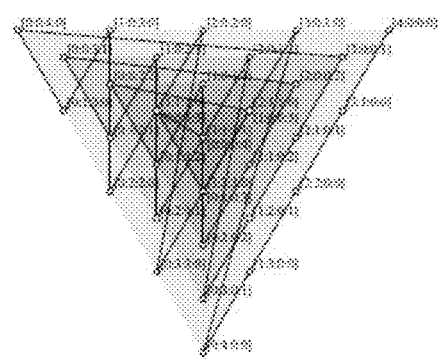
FIG. 29A: Ascendant    FIG. 29B: Descendant
Hamilton Cantor paths

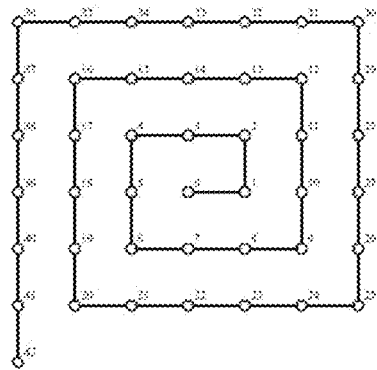 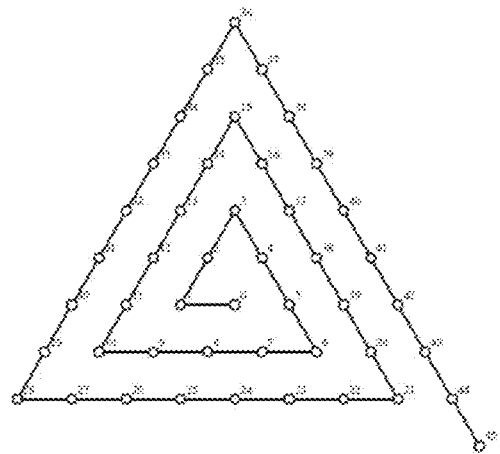
FIG. 31A: Orthogonal 4-Spiral     FIG. 31B: Triangular 3-Spiral
FIGURE 31: Spiral paths

```
> SPIORDc:=proc(v2)                    > ORDSPIc:=proc(num)
> local x,y,ind;                       > local eq,eq0,eq1,x,y;
> x:=v2[1];                            > eq:=isqrt(num);
> y:=v2[2];                            > eq0:=(eq-1)*eq;
> if (x=0) and (y=0)                   > eq1:=eq*eq;
>   then                               > if type(eq,odd)
>     ind:=0;                          >   then
>   end if;                            >     if (num < eq1)
> if (x > 0) and (abs(y) <= abs(x))    >       then
>   then                               >         y:=1-(eq+1)/2;
>     ind:=4*x^2-3*x+y;                >         x:=num-eq0+y;
> end if;                              >       else
> if (y > 0) and (abs(x) <= abs(y))    >         x:=(eq+1)/2;
>   then                               >         y:=num-eq1-x+1;
>     ind:=4*y^2-y-x;                  >     end if;
> end if;                              >   else
> if (x < 0) and (abs(y) <= abs(x))    >     if (num < eq1)
>   then                               >       then
>     ind:=4*x^2-x-y;                  >         y:=eq/2;
> end if;                              >         x:=eq0+y-num;
> if (y < 0) and (abs(x) <= abs(y))    >       else
>   then                               >         x:=-eq/2;
>     ind:=4*y^2-3*y+x;                >         y:=eq1-x-num;
> end if;                              >     end if;
> ind;                                 > end if;
> end proc:                            > [x,y];
                                       > end proc:
```

FIGURE 32: Spiral Cartesian coding and decoding

```
> SPIORDa:=proc(v2)                    > ORDSPIa:=proc(z)
> local ind,x,y;                       > local ind,i,j,ior,imod,x,y;
> x:=v2[1];                            > i:=iquo((isqrt(1+8*z)-3),2)+1;
> y:=v2[2];                            > ior:=i*(i+1)/2;
> if (x > 0) and (y <= 2*x)            > j:=z-ior;
>   then                               > imod:=i mod 3;
>     ind:=x*(9*x-7)/2+y;              > if (imod = 2)
>   else                               >   then
>     if (y < 0) and (x <= 2*y)        >     x:=i/3-j+1/3;
>       then                           >     y:=2*i/3-j+2/3;
>         ind:=y*(9*y-7)/2+x;          >   else
>       else                           >     if (imod = 1)
>         ind:=(9*(x-y)^2-x-y)/2;      >       then
>     end if;                          >         x:=(i-1)/3+1;
> end if;                              >         y:=j-(i-1)/3;
> ind;                                 >       else
> end proc:                            >         x:=j-2*i/3;
                                       >         y:=-i/3;
                                       >     end if;
                                       > end if;
                                       > [x,y];
                                       > end proc:
```

FIGURE 33: Spiral affine coding and decoding

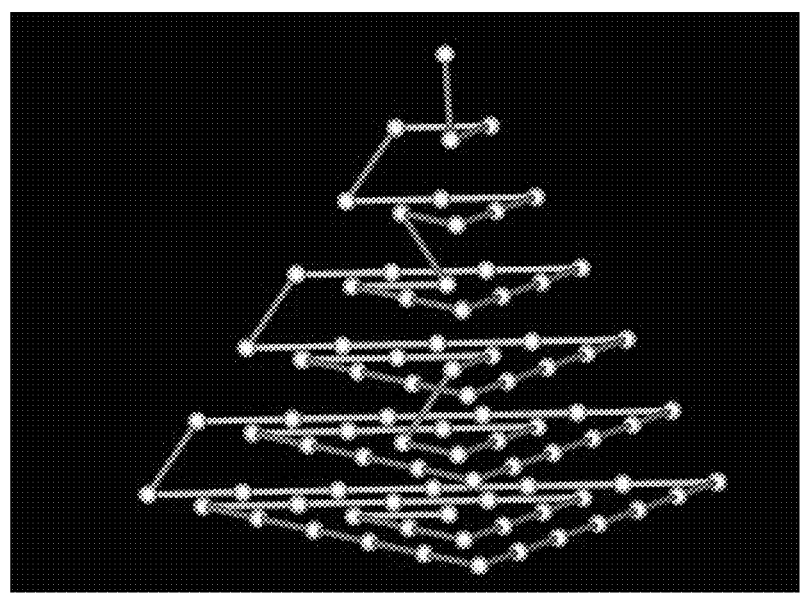
Figure 34: $T_{6,3}$ spiral chain

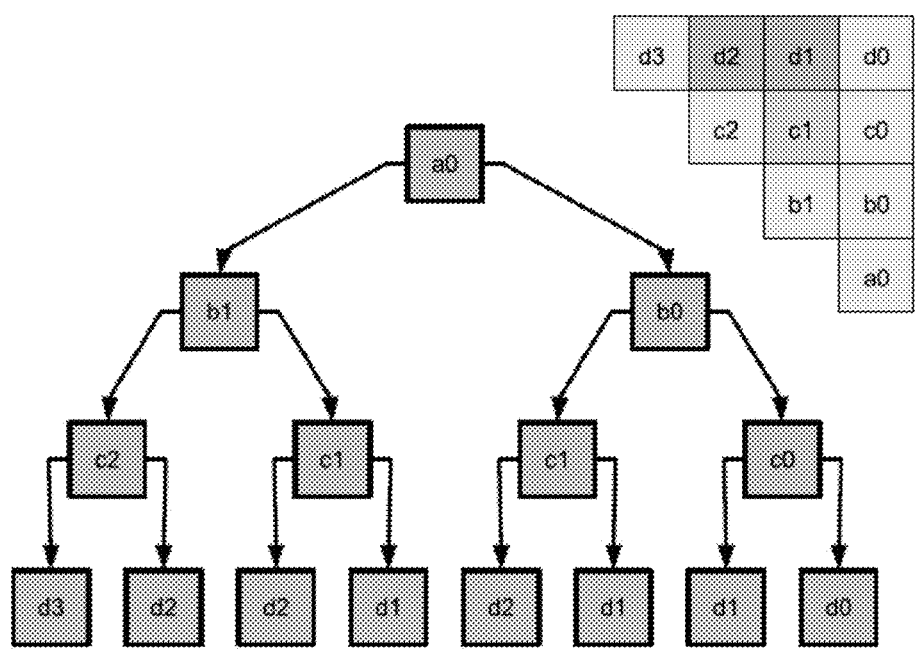
FIGURE 35: Convolution mechanism

|   |   |   |   |   |   |   |   |   |   |   |
|---|---|---|---|---|---|---|---|---|---|---|
| 0 | 1 |   |   |   |   |   |   |   |   |   |
| 1 | 1 | 1 |   |   |   |   |   |   |   |   |
| 2 | 1 | 2 | 1 |   |   |   |   |   |   |   |
| 3 | 1 | 3 | 3 | 1 |   |   |   |   |   |   |
| 4 | 1 | 4 | 6 | 4 | 1 |   |   |   |   |   |
| 5 | 1 | 5 | 10 | 10 | 5 | 1 |   |   |   |   |
| 6 | 1 | 6 | 15 | 20 | 15 | 6 | 1 |   |   |   |
| 7 | 1 | 7 | 21 | 35 | 35 | 21 | 7 | 1 |   |   |
| 8 | 1 | 8 | 28 | 56 | 70 | 56 | 28 | 8 | 1 |   |
| 9 | 1 | 9 | 36 | 84 | 126 | 126 | 84 | 36 | 9 | 1 |

FIGURE 36: Vandermonde convolutions for $\binom{9}{3}$

```
> CRKREC:=proc(r,k)
> local i,acc;
> if k=0 then return 1; end if;
> if k=1 then return r; end if;
> if k=r
>   then 1;
> else
>   acc:=0;
>   for i from 0 to k do
>     acc:=acc+CRKREC(r-k,min(k-i,r-k-k+i))*CRKREC(k,min(i,k-i));
>   end do;
> return acc;
> end if;
> end proc:
```

FIGURE 37. Récursivité par addition de produits

FIGURE 37 – Sum-of-products recursion

```
> XENUME:=proc(x,y)                > YENUME:=proc(x,y)
> local i,alpha,res;                > local acc,i,m,n,res;
> alpha:=1;                         > m:=x;
> res[1]:=1;                        > n:=y-x;
> for i from 1 to x do              > acc:=1;
>  alpha:=(alpha*(y+1-i))/i;        > res[1]:=1;
>  res[i+1]:=alpha;                 > for i from 1 to n do
> end do;                           >  acc:=(acc*(m+i))/i;
> convert(res,array);               >  res[i+1]:=acc;
> end proc:                         > end do;
                                    > acc;
                                    > convert(res,array);
                                    > end proc:
```

FIGURE 38 – Per column and per line binomial computation

```
> Combo:=proc(m,n)
> local mt,nt,xx,i,acc,res,den;
> if n < 0 then return 0; end if;
> if type(n,odd)
>   then
>     mt:=m+(n+1)/2;
>     acc:=mt;
>     nt:=(n-1)/2;
>   else
>     mt:=m+(n+2)/2;
>     acc:=mt*(m+1);
>     nt:=(n-2)/2;
> end if;
> xx:=mt*mt;
> for i from 1 to nt do
>   den:=4*i*i+2*i;
>   acc:=acc*(xx-i*i)/den;
> end do;
> if type(n,odd)
>   then acc;
>   else acc/n;
> end if;
> end proc;
```

FIGURE 39: Squares differences product computation (A) Triangle (B) Rectangle

Pascal's triangle indexing changes

```
> PRODYN:=proc(m,n)
> local i,j,T;
> for i from 1 to n+1 do
>   T[i]:=1;
> end do;
> for i from 1 to m do
>   for j from 2 to n+1 do
>     T[j]:=T[j]+T[j-1];
>   end do;
> end do;
> end proc:
```

FIGURE 41: Dynamic programming

```
> MATPRT:=proc(vn0,vn1,n)
> local i,j,acc,wn;
> acc:=0;
> wn:=array(1..n+1);
> for i from 0 to n do
>   for j from i to 0 by -1 do
>     acc:=acc+vn0[j+1]*vn1[i-j+1];
>   end do;
> wn[i+1]:=acc;
> acc:=0;
> end do;
> convert(wn,list);
> end:
```

FIGURE 42: Simplified matrix product

| $2^0$ | $2^1$ | $2^2$ | | | | | | $2^3$ | $2^4$ | | $2^5$ | |
|---|---|---|---|---|---|---|---|---|---|---|---|---|
| 1 | 1 | 1 | 1 | 1 | 1 | 1 | 1 | 1 | 1 | 1 | 1 | 1 |
| 1 | 2 | 3 | 4 | 5 | 6 | 7 | 8 | ... | 16 | ... | 32 | ... |
| 1 | 3 | 6 | 10 | 15 | 21 | 28 | 36 | ... | ... | ... | ... | ... |
| 1 | 4 | 10 | 20 | 35 | 56 | 84 | 120 | ... | ... | ... | ... | ... |
| 1 | 5 | 15 | 35 | 70 | 126 | 210 | 330 | ... | ... | ... | ... | ... |
| 1 | 6 | 21 | 56 | 126 | 252 | 462 | 792 | ... | ... | ... | ... | ... |
| 1 | 7 | 28 | 84 | 210 | 462 | 924 | 1716 | ... | ... | ... | ... | ... |

FIGURE 43A: Binary Addressing

| 1 | 2 | 3 | | 5 | | | 8 | | | | | 13 |
|---|---|---|---|---|---|---|---|---|---|---|---|---|
| 1 | 1 | 1 | 1 | 1 | 1 | 1 | 1 | 1 | 1 | 1 | 1 | 1 |
| 1 | 2 | 3 | 4 | 5 | 6 | 7 | 8 | ... | ... | ... | ... | 13 |
| 1 | 3 | 6 | 10 | 15 | 21 | 28 | 36 | ... | ... | ... | ... | ... |
| 1 | 4 | 10 | 20 | 35 | 56 | 84 | 120 | ... | ... | ... | ... | ... |
| 1 | 5 | 15 | 35 | 70 | 126 | 210 | 330 | ... | ... | ... | ... | ... |
| 1 | 6 | 21 | 56 | 126 | 252 | 462 | 792 | ... | ... | ... | ... | ... |
| 1 | 7 | 28 | 84 | 210 | 462 | 924 | 1716 | ... | ... | ... | ... | ... |

FIGURE 43B: Fibonacci Addressing

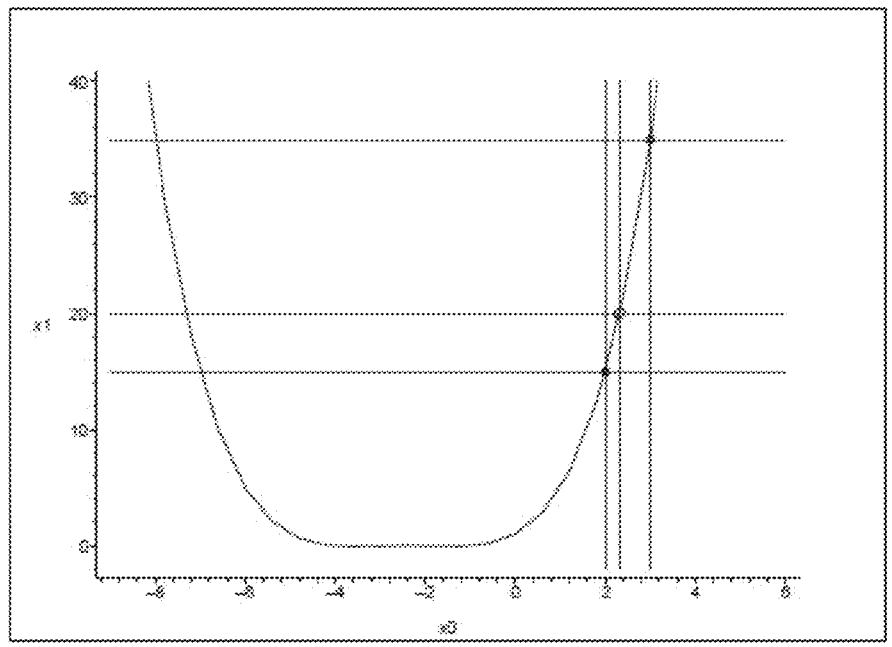
FIGURE 44: $y = \dfrac{(m+1)(m+2)(m+3)(m+4)}{4!}$

```
> ENCDEC:=proc(y0,n)
> local i,j,prd,g,p,prdsv,dens;
> if y0 <= n
>   then return 0;
> end if;
> p:=DIGBIN(y0,n);
> g:=10^(p-1);                          > DIGBIN:=proc(y0,n)
> for i from 1 to p do                  > local x,prd,p,dens,acc;
>   prd:=g;                             > x:=1;
>   dens:=1;                            > prd:=1;
>   for j from 1 to 10                  > p:=-1;
>     while dens >= 0 do                > dens:=1;acc:=1;
>       prdsv:=prd;                     > while dens >= 0 do
>       prd:=g+j*10^(p-1);              >   prd:=Comb(x,n);
>       dens:=y0-Comb(prd,n);           >   dens:=y0-prd;
>   end do;                             >   x:=x*10;
> g:=prdsv;                             >   p:=p+1;
> end do;                               > end do;
> g;                                    > p;
> end proc:                             > end proc:
```

FIGURE 45: The Spigot method

```
> NUMFCT:=proc(x,n,g)
> local i,acc;
> acc:=1;
> for i from 1 to n do
>   acc:=acc*(x+g*i);
> end do;
> end proc:
```

FIGURE 46: Diophantine series

```
> DRVREC:=proc(n,k)
> if (n < 0) or (k < 0)
> then
>   return 0:
> else
>   if (n = 0) and (k = 0)
>   then
>     return 1:
>   else
>     return DRVREC(n-1,k)*(m+n)+k*DRVREC(n-1,k-1):
>   end if;
> end if;
> end proc:
```

FIGURE 47. Calcul récursif de la dérivée $k$-ième

FIGURE 47: Recursive computation of the k-th derivative

```
> DRVSYM:=proc(n)
> local i,mi,num,den,prd,fac,drv,xi;
> drv:=1;
> prd:=x+1;
> fac:=1;
> for i from 1 to n do
>   num:=prd-fac*y0;
>   den:=drv;
>   xi:=(x+i+1);
>   drv:=drv*xi+prd;
>   prd:=prd*xi;
>   fac:=fac*(i+1);
> end do;
> x-num/den;
> end proc:
```

FIGURE 48 – Raphson-Newton nth degree schema

```
> BINRP4:=proc(x)
> local x0,a,b,c,d,res;
> a:=ENCDEC(x,4);
> x0:=x-Comb(a,4);
> b:=ENCDEC(x0,3);
> x0:=x0-Comb(b,3);
> c:=ENCDEC(x0,2);
> d:=x0-Comb(c,2);
> [d,c+1,b+1,a+1];
> end proc:
```

FIGURE 49 – Quaternary combinatorial decomposition for a given number

```
> BINRPNi:=proc(x,n)
> local i,ind,a,x0,ls,res;
> x0:=x;
> for i from 1 to n-1 do
>   ind:=n+1-i;
>   a:=ENCDEC(x0,ind);
>   x0:=x0-Comb(a,ind);
>   if x0 < 0
>   then
>     x0:=0;
>     ls[i]:=a;
>   else
>     ls[i]:=a+1;
>   end if;
> end do;
> ls[n]:=x0;
> convert(ls,array);
> end proc:
```

```
> RPNBINi:=proc(vn,n)
> local i,acc,accsv;
> acc:=0;
> for i from 1 to n do
>   accsv:=Comb(vn[n-i+1]-1,i);
>   acc:=acc+accsv;
> end do;
> end proc:
```

FIGURE 50 – N-ary pyramidal representation

```
> GLOBALo:=proc(v2)                      > LOCALo:=proc(x)
> local m,n,t0,acc,alpha,i,t2;           > local i,acc,j,ind,alpha;
> m:=v2[1];                              > acc:=0;
> n:=v2[2];                              > for i from 0 while x >= acc do
> t0:=m+n+1;                             >   acc:=2^i;
> acc:=0;                                > end do;
> alpha:=1;                              > ind:=x-2^(i-2);
> for i from 1 to m do                   > acc:=0;
>   acc:=acc+alpha;                      > alpha:=1;
>   alpha:=(alpha*(t0-i))/i;             > for j from 1 while ind >= acc do
> end do;                                >   acc:=acc+alpha;
> t2:=2^(m+n)+acc;                       >   alpha:=(alpha*(i-1-j))/j;
> end proc:                              > end do;
                                         > [j-2,i-j];
                                         > end proc:
```

FIGURE 51: Global and local encoding optimization

```
> ORDNUMo:=proc(v3)
> local ind,m,n,d,i,x,v2;
> ind:=v3[1];                          > ORINUMo:=proc(ind,m,n)
> m:=v3[2];                            > local j,t0,t1,exp;
> n:=v3[3];                            > if ind = 0
> d:=n;                                > then [m,0];
> for i from 1 to d+1 do               > else
>   x[i]:=0;                           >   t1:=1;
> end do;                              >   for j from 1 to m do
> for i from 1 to d do                 >     t0:=t1;
>   v2:=ORINUMo(ind,m,n);              >     t1:=(t1*(n+j))/(j);
>   x[i]:=v2[1];                       >     if t1 > ind then
>   ind:=v2[2];                        >       exp:=m-j;
>   m:=m-x[i];                         >       j:=m;
>   n:=n-1;                            >     end if;
> end do;                              >   end do;
> x[d+1]:=m;                           >   [exp,ind-t0];
> convert(x,array);                    > end if;
> end proc:                            > end proc:
```

FIGURE 52: Numeric decoding optimization

```
> INDCOM:=proc(vn,n)                        > COMIND:=proc(x)
> local m,x,v4,deg,a,b;                     > local y,v4,x0,x1,x2,m,n;
> m:=VECDEG(vn,n);                          > v4:=BINRP4(x);
> x:=NUMORD(vn,n);                          > m:=v4[1];
> a:=ENCDEC(x,2);                           > n:=v4[2]-v4[1];
> b:=x-Combo(a,2);                          > x0:=v4[3]-v4[2];
> v4:=[b,a+1-b,n,m];                        > x1:=v4[4]-v4[3];
> deg:=VECDEG(v4,3);                        > x2:=1/2*(x0+x1)*(x0+x1+1)+x1;
> NUMORD(v4,3)+Combo(deg-1,4);              > ORDNUMo([x2,m,n]);
> end proc:                                 > end proc:
```

FIGURE 53: Compressed encoding and decoding

```
> MPLNUM:=proc(va,vb,dga,dgb,dim)
> local i,j,k,r,dgr,lga,lgb,lgr,v,siga,sigb,sigr,ind;
1 dgr:=dga+dgb;
2 lga:=1;
3 lgb:=1;
4 lgr:=1;
5 for k from 1 to dim do
6   lga:=lga*(dga+k)/k;
7   lgb:=lgb*(dgb+k)/k;
8   lgr:=lgr*(dgr+k)/k;
9 end do;
10 for k from 1 to lgr do v[k]:=0; end do;
11 for i from 1 to lga do
12  for j from 1 to lgb do
13    siga:=ORDNUM([lga-i,dga,dim]);
14    sigb:=ORDNUM([lgb-j,dgb,dim]);
15    sigr:=AddPol(siga,sigb,dim+1);
16    ind:=lgr-NUMORD(sigr,dim)-1;
17    v[ind+1]:=v[ind+1]+va[i]*vb[j];
18  end do;
19 end do;
20 convert(v,array);
21 end proc:
```

FIGURE 54: Product of two multivariate polynomials

METHOD AND SYSTEM FOR CODING INFORMATION

CROSS REFERENCE TO RELATED APPLICATIONS

This patent application is a National Phase Application of PCT International Application No. PCT/CA2012/001042, International Filing Date Nov. 13, 2012, claiming priority of Canadian Patent Application No. 2,758,243, entitled "Method and apparatus for encoding information" which was filed Nov. 10, 2011, which are hereby incorporated by reference in their entirety.

FIELD OF THE INVENTION

This invention relates to the field of coding. More specifically, the innovation relates to a method and system for coding information through a hyper-pyramid.

BACKGROUND OF THE INVENTION

Let $x_{o, \ldots, n}$ be integers belonging to a list of integers and X the generated integer. Encoding a natural list of integers into a single integer and its inverse function is equivalent to finding encoding and decoding functions which provide the following correspondence:

$$\text{Code}(x_{o, \ldots, n}) \rightarrow X \Leftrightarrow \text{Decode}(X) \rightarrow x_{o, \ldots, n}$$

A coding system consists of establishing a law of correspondence, called code, between the information to be represented and the obtained numbers, such that for each information usually corresponds to a single number from which it will be possible to retrieve the original information.

Some coding strategies are based on some bijective function mechanisms, for example those in the Fundamental Theorem of Arithmetic or those in methods to generated numbers through polynomials. In the first instance, the uniqueness of the decomposition of a number into a product of prime factors is the bijection's key mechanism. In the second instance, the uniqueness of the decomposition of a number into a sum of elementary numbers must first be established.

For example, Fibonacci coding concatenates a list of integers in a single binary number such that the separators between integers are represented by the binary pattern 11.

Fibonacci([1, 2, 3, 9, 8, 7]) →

$$\{110110011100011000011010111\}_2 \rightarrow \{57088107\}_{10}$$

$$\underset{11011001110001100001101011}{\underline{1\quad 2\quad 3\quad\quad 9\quad\quad 8\quad\quad 7}}$$

The person skilled in the art will appreciate that, in general, beyond the theoretical choice of encoding method, the length of the list to be encoded and the dimension of integers to be treated should be considered an essential problem from the practical and applicative points of view.

The person skilled in the art will also appreciate that apart from the problem of compression of the integer list, the generated code size, i.e. the number of representative digits, is a fundamental element in the choice of coding methods.

Given the dimension of data to be processed and levels of computational complexity encountered, performance loss, especially during decoding phases, is almost immediate and disqualifies some theoretically interesting methods regarding the initial coding phase.

Various encoding methods addressing different theoretical problems like the compression, transmission, structuration or encryption of data, the properties of generated codes can be very different in each case.

In coding systems which preserve indexing, the law of correspondence is an order relation which calculates the rank of a list or sequence of integers, and allows classifying and sorting of this list from a unique integer which, in turn, can be decoded to restore the list.

The person skilled in the art will appreciate that there are many possible coding applications. In particular, the ordering of certain sequences of integers is generally the first objective of coding methods using indexing.

Sequences to be ordered essentially belong to the field of combinatorics, e.g. combinations or permutations that must be ordered.

There are numerous applications, ranging from linear algebra, algebraic geometry and graph theory, to the sorting of dictionaries in alphabetical order or enumeration and positioning of combinations in game theory.

How to index a lattice is particularly important in routing problems and parallel algorithms. Thus, the routing can be defined as a software or hardware mechanism that routes information between the source and destination in a communication network incompletely connected, static or dynamic: it selects the best paths in a network, it manages conflicts, and finally it ensures that messages arrive well and in the proper order.

The addressing of data as well as its data structure storage areas in databases or data structures is the basis of numeric information access and its structuring.

The interest of coding information by indexing is to overcome any physical memory organization problem, prior to data manipulation. The physical organization is typically based on the notions of tables or lists whose structure, size and memory location must be explicitly declared. In contrast, coding by indexing enables an implicit description of the information through the properties of the encoded number. For example, the representation of the information in spreadsheets uses standard file formats which specify the convention according to which information is encoded for storage. These formats, such as the Comma Separated Value, describe explicitly how the information should be saved.

The person skilled in the art will appreciate furthermore that the lattice indexing functions can be used as powerful hash functions. To optimize information access, using mathematical functions called hash functions, hashing methods allow a table index to be computed directly from an alphanumeric string called the key. The area of the memory directly indexed thus contains the information associated with the key or a new set of addresses, allowing to indirectly access these addresses.

The person skilled in the art will also appreciate that electronic identification is increasingly used to ensure the traceability of objects, food or living beings. The various kinds of identifiers are for registration, for indexing information: the primary key, or else for the connection. Coding-by-indexing systems are particularly well suited to these types of problems because, in particular, they facilitate alphanumeric sorting and allow rapid identification in databases.

Finally, functions for encoding or mathematical pairing provide the foundation of encryption systems and of the biunique relationship between the operation of coding and decoding. The use of properties of coded numbers such as the prime factor decomposition of a number, may also serve as an independent or complementary approach.

In positional coding, positional number systems are used for coding and decoding vectors of integers from a base of numeration greater than the cardinal number count k−1 of the coding alphabet. The result for encoding the vector $(\alpha_0, \ldots, \alpha_k)$ in base k will be $$I_B = \alpha_0 \cdot B^k + \alpha_1 \cdot B^{k-1} + \ldots + a_k \cdot B^0$$

For example, if the integers (1, 2, 3, 4, 5, 6, 7, 8, 9) are associated with letters of the alphabet (A, B, C, D, E, F, G, H, I), the following code will be obtained, $2 \cdot 10^6 + 1 \cdot 10^5 + 2 \cdot 10^4 + 2 \cdot 10^3 + 1 \cdot 10^2 + 7 \cdot 10^1 + 5 \cdot 10^0 \rightarrow \{2122175\}_{10}$ corresponding to the word BABBAGE encoded in base 10. In this case, because the alphabet does not exceed the number of digits available, the resulting code is a simple substitution of letters in the word by the corresponding digits. By enriching the alphabet, the computation of polynomials becomes necessary, such as encoding the letters on more than one digit, for example, in hexadecimal numeration with A=10, B=11 . . . .

The person skilled in the art will appreciate that the encoding of a list of integers can be realized from modular representation of integers, called "Residue Number System" i.e. (RNS).

The RNS system is defined from a set of relatively prime integers, called modules and denoted $\{m_0, m_1, \ldots, m_n\}$. Therefore GCD $(m_i, m_j) = 1$, with $i \neq j$. An integer X can then be represented by a set of integers called residues $\{r_0, r_1, \ldots, r_n\}$ such that $x_i = X \mod m_i$ where $0 \leq x_i < m_i$. Moreover, this representation is unique for $X \leq M-1$ with $M = \Pi_{i=0}^{n-1} m_i$.

The coding principle is to consider the list of integers to encode as a list of residues and to find the associated decimal representation. To find modules greater than the respective integers of the list, we can use a sequence of successive primes, which are all greater than their residues or start with the first prime number immediately above the maximum integer in the list to encode. The example below shows the encoding of the 5-dimensional projective point with the homogeneous coordinates [69, 78, 73, 71, 77, 65], starting with the module 73. The encoding function, called Chinese, is essentially a function which solves a system of congruencies from a set of residues.

Chinese([69,78,73,71,77,65],[73,79,83,89,97,101])→ {252617134512}

252617134512 mod 73=69 . . . 252617134512 mod 101=65

The decoding of the decimal number not being unique, it follows that we must know the triplet (Code, initial module, length of the list) to perform the decoding. The triplet will be therefore noted $\{2526171345121\}_{(73,55)}$. The list could be encoded with an infinity of other triplets such as $\{412251249819\}_{(79,5)}$, 79, being in this case the first integer is greater than 78.

Cantor coding is associated with the notion of pairing function, which was developed to address the problem of countability of natural numbers. Cantor's pairing function is reduced to a second degree polynomial with the X and Y coordinates of the Cartesian plane as variables. Using this formula, FIG. 1 shows the order in which each pair of coordinates is associated with the indices. For example, $I_{K_2}(1,2) \rightarrow 8$. It is possible to obtain another pairing polynomial by substituting y by x, in which case we obtain $I_{K_2}(1,2) \rightarrow 7$.

$$I_{K_2} = \frac{(x+y)*(x+y+1)}{2} + y$$

A boustrophedon version is illustrated in FIG. 1*b*.

The Cantor pairing function, which allows encoding and decoding of a pair of integers, has been extended to any number of integers in two different ways. The first is by regrouping successively integers by forming pairs of pairs of integers. Based on the initial Cantor encoding function, this method has the advantage of simplicity; a polynomial of degree 2 generates n-degree polynomials. This exponential growth affects in particular the dimension of the calculated indices. An alternative to this approach is the n-dimensional extension of the pairing function. An expression based on binomial coefficients is presented by Cegielski and Richard, in the following form:

$$K(x_1, \ldots, x_k) = \binom{x_1 + \ldots + x_k + k - 1}{k} + \binom{x_1 + \ldots + x_{k-1} + k - 2}{k - 1} + \ldots + \binom{x_1 + x_2 + 1}{2} + \binom{x_1}{2}.$$

Unfortunately the n-dimensional Cantor pairing function is not bijective. Some vectors of integers of different dimensions can generate the same encoded number. This problem also exists with the pairing of successive pairs. In this case and by convention, we can add a new coordinate, as arity of the initial vector. In Ernesto Pascal's coding, an integer N can be represented in a unique way for a certain degree n as follows:

$$N = \binom{x_n}{n} + \ldots + \binom{x_2}{2} + \binom{x_1}{1}, x_n > \ldots > x_2 > x_1 \geq 0.$$

The number 1000 will be represented for example by the sequence $(12, 9, 8, 7, 6, 5, 3)_{Cns}^7$ corresponding to the first seven columns of the Pascal's triangle or by the sequence $\{19, 8, 3\}_{Cns}^3$ corresponding to the first three columns. Therefore, this coding applies to strictly decreasing sequences of integers and is used to solve the problem of lexicographic ordering of r-combinations of $a_1, a_2, \ldots, a_k$ of $\{1, 2, \ldots, r\}$. The formula can be slightly modified to calculate the index of a given combination in the form of an increasing sequence of integers, in which case the following is obtained:

$$\binom{r}{k} - \binom{r - a_1}{k} - \binom{r - a_2}{k - 1} - \ldots - \binom{r - a_2}{2} - \binom{r - a_k}{1}.$$

There is therefore a need for a method of encoding information which solves at least one problem of the prior art.

LIST OF FIGURES

FIG. 1*a* illustrates Cantor ordering while FIG. 1*b* illustrates the boustrophedon Cantor ordering.

FIGS. 2A and 2B illustrate De Gua de Malves's triangle and its projective extension.

FIGS. 3A and 3B illustrate a pyramidal lattice and the labeling of projective coordinates.

FIG. 5 illustrates an implementation of the GLOBAL algorithm and an implementation of the LOCAL algorithm.

FIG. 6 illustrates recursive trees for $$\binom{4}{2}.$$

FIG. 7 illustrates the positional indexing of $T_{3,2}$ in quaternary base.

FIG. 8 illustrates the expansion of large integers.

FIG. 9 illustrates the numeric order for the $T_{4,3}$ lattice.

FIG. 10 illustrates an implementation of the NUMORD algorithm.

FIG. 11 shows a decomposition of a pyramidal number.

FIG. 12 illustrates an implementation of the ORDNUM algorithm.

FIG. 13 illustrates the lexicographic encoding of the $T_{4,3}$ lattice.

FIG. 14 illustrates an implementation of the LEXORD algorithm.

FIG. 15 illustrates an implementation of the ORDLEX algorithm.

FIG. 16 shows the Gray projective encoding (4,3).

FIG. 17 illustrates an implementation of the GRAORD algorithm.

FIG. 18 illustrates the path of $T_{4,3}$ in the Gray projective order.

FIG. 19 illustrates an implementation of the ORDGRA algorithm.

FIG. 20 illustrates an implementation of the VN2VVM algorithm and VM2VN algorithm.

FIG. 21 illustrates the $$\binom{6}{4}$$

combinatorial tree.

FIG. 22 shows the $$\binom{6}{4}$$

tree and numeric labels.

FIG. 23 shows the $$\binom{6}{4}$$

tree and the lexicographic labels.

FIG. 24 illustrates an example of a combinatorial projective subspace.

FIG. 25 illustrates an example of bijection between projective points and the combinations.

FIG. 26 illustrates an example of generating both projective and binary combinations.

FIG. 27 illustrates the Euclidean and affine coordinates of a Cantor point.

FIG. 28 illustrates the taxonomy for orderings.

FIG. 29 illustrates Cantor paths.

Figure 30:
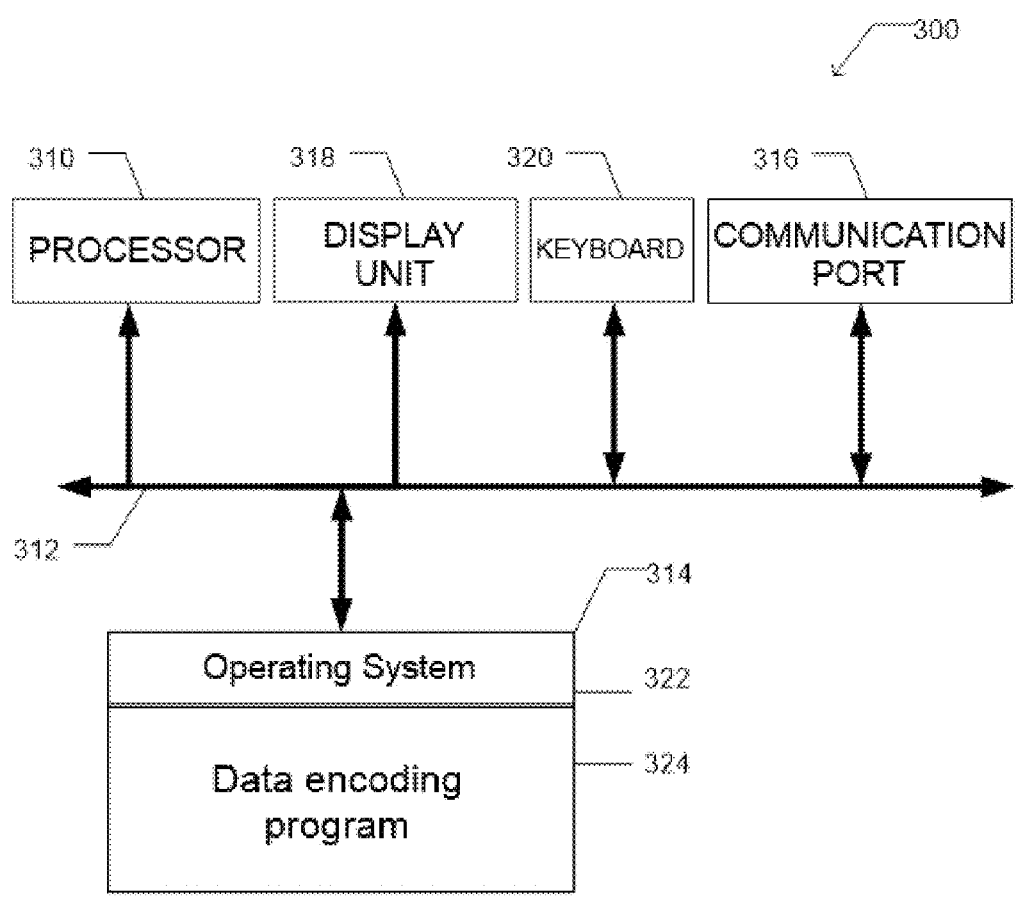

FIG. 30 illustrates a possible implementation of the method for encoding information.

FIG. 31 illustrates some spiral paths.

FIG. 32 shows an implementation of the SPIORDc algorithm and ORDSPIc algorithm.

FIG. 33 illustrates an implementation of the SPIORDa and ORDSPIa algorithms.

FIG. 34 illustrates a spiral chain for $T_{6,3}$.

FIG. 35 illustrates a mechanism of convolution.

FIG. 36 illustrates Vandermonde's convolution for $$\binom{9}{3}.$$

FIG. 37 shows an implementation of the CRKREC algorithm.

FIG. 38 illustrates an implementation of the XENUME algorithm and YENUME algorithm.

FIG. 39 shows an implementation of the COMBO algorithm.

Figure 40A:
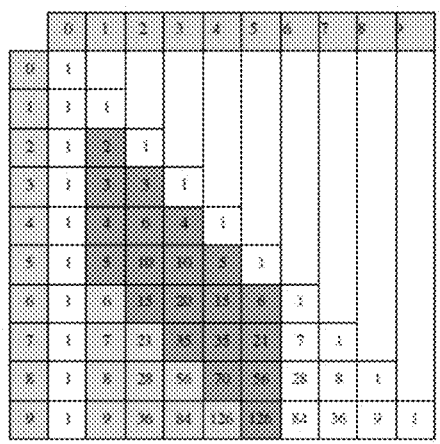
Figure 40B:
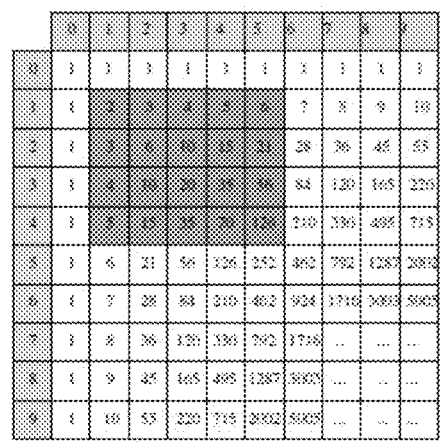

FIGS. 40A and 40B show the indexing change of the Pascal's triangle.

FIG. 41 shows an implementation of the PRODYN algorithm.

FIG. 42 shows an implementation of the MATPRT algorithm.

FIGS. 43a and 43b illustrate a matrix multiplication between columns.

FIG. 44 shows a curve that, for a given dimension, represents the values of the binomial coefficients.

FIG. 45 shows an implementation of the ENCDEC algorithm and DIGBIN algorithm.

FIG. 46 shows an implementation of the NUMFCT algorithm.

FIG. 47 shows an implementation of the DRVREC algorithm.

FIG. 48 shows an implementation of the DRVSYM algorithm.

FIG. 49 shows an implementation of the BINRP4 algorithm.

FIG. 50 shows an implementation of the BINRPNi algorithm and RPNBINi algorithm.

FIG. 51 shows an implementation of the GLOBALo and LOCALo algorithms.

FIG. 52 shows an implementation of the ORDNUMo and ORINUMo algorithms.

FIG. 53 shows an implementation of the INDCOM and COMIND algorithms.

FIG. 54 shows an implementation of the MPLNUM algorithm.

SUMMARY

According to one aspect of the invention, there is disclosed a method for encoding information, the method comprising obtaining a list of integers to be encoded; determining a hyper-pyramid having a dimension adapted to encode the list of integers, the hyper-pyramid having a plurality of vertices whose number is determined by the degree of the hyper-pyramid, which is equal to the sum of the integers in the list of integers, and by the dimension of the hyper-pyramid which is equal to the number of integers in the list minus one; indexing the list of integers in the hyper-pyramid using an indexing system; and providing an indication of indexing of the list of integers in the hyper-pyramid.

According to one embodiment, the method further comprises providing a list of alphanumeric codes and transforming the list of alphanumeric codes into the list of integers to encode.

According to one embodiment of the method, the indexing system allows each vertex of the plurality of the vertices of said hyper-pyramid to be indexed.

According to one embodiment of the method, the indication of the indexing of the list of integers in the hyper-pyramid includes an integer representing the index of projective point in the indexing system, m being the total degree of said list of integers and n being the number of integers in the list.

According to one embodiment, the method further comprises converting the integer representing the projective point in the indexing system into combinatorial coordinates mx and nx.

According to one embodiment, the method further comprises processing m, the total degree of the list of integers, and n, the number of integers in the list of integers into an integer Y representing an overall index.

According to one embodiment, the method further comprises summing the integer Y representing an overall index with the integer representing the index of the projective point, in order to provide a total index Z. The indication of the indexing of the hyper-pyramid includes the total index Z.

According to one embodiment of the method, the list of integers is obtained from a file.

According to one embodiment of the method, the step of providing the indication of the indexing in the hyper-pyramid includes storing said indication of the indexing in a file.

According to one embodiment of the method, the step of providing the indication of the list of integers in the hyper-pyramid includes transmitting the indication of the indexing of the list of integers to a processing unit via a network.

According to one embodiment the method further includes providing a list of integers and generating the list of whole numbers using the list of integers.

According to one embodiment, the step of providing the indication of the indexing of the list of integers in the hyper-pyramid includes displaying the indication of the indexing on a display.

According to one embodiment, the method is used for compressing a string of characters associated with said list of integers.

According to one embodiment, the method is used for coding a list of lists, the method comprising an iterative use of the method for coding a list of lists.

According to one embodiment, the method is used for encrypting a list of integers, wherein the indexing of the list of integers corresponds to an encryption of the list of integers.

According to one aspect, a method is described for decoding information encoding using the method for encoding the information disclosed above, the method comprising obtaining an indication of the indexing of the list of integers in the hyper-pyramid; obtaining an indication of an indexing system used to generate said indication of the indexing of the list of integers in the hyper-pyramid; determining, using the indexing system and the indication of the indexing of the list of integers, said list of integers; and providing said list of integers.

According to another aspect of the invention, a computer comprising a display unit, a processor, a data storage unit comprising a program configured to be executed by the processor to encode information, the program comprising instructions for obtaining a list of integers to be encode; instructions for determining a hyper-pyramid having a dimension adapted for encoding the list of integers, the hyper-pyramid having a plurality of vertices whose number is determined by the degree of the hyper-pyramid, which is equal to the sum of the integers in the list, and by the dimension of the hyper-pyramid that is equal to the number of integers in the list of integers minus one; instructions for indexing the list of integers in the hyper-pyramid using an indexing system; and instructions for providing an indication of an indexing of the list of integers in the hyper-pyramid.

According to another aspect of the invention, a non-transitory computer storage medium for storing programming instructions executable by a processor, which when executed will cause the execution by the processor of a method for encoding information, the method comprising obtaining a list of integers to be encoded; determining a hyper-pyramid having a dimension adapted for encoding the list of integers, the hyper-pyramid having a plurality of vertices whose number is determined by the degree of the hyper-pyramid, which is equal to the sum of the integers of the list of integers and the dimension of the hyper-pyramid which is equal to the number of integers in the list of integers minus one; indexing the list of integers in the hyper-pyramid using an indexing system; and providing an indication of the indexing the list of integers in the hyper-pyramid.

An advantage of the system described is that it is an "e pluribus unum" polymorphic system, since it is a combined system capable of both coding and indexing but also of transcoding between coding systems based on the combinatorial binomial coefficients.

An advantage of the system described is that it addresses the problem of the coding/indexing/transcoding of integer lists without any predefined combinatorial structures as well as of specific lists with predefined combinatorial structures such as lists of coefficients of polynomials or lists of combinations without repetitions.

Another advantage of the described system is that it can work in dual mode, in bijective encoding mode Code $(X) \rightarrow Y$ and Decode $(Y) \rightarrow X$ or in encryption mode $(X) \rightarrow Y$ Decode $(Y, \text{key } 1, \text{key } 2) \rightarrow X$.

Another advantage of the described system is that it can provide a solution to various problems such as: the nature and dimension of the data, the dimension of the encoding/decoding program, and the size and properties of the generated code.

Concerning the nature and dimension of the data, the described method may allow the use of structured or unstructured data of any size.

In terms of dimension of encoding/decoding programs, it is possible to implement the computer code by a few dozens of instructions and by using a standard library for arbitrary precision arithmetic such as the GNU Multiple Precision Arithmetic Library (GMP).

Regarding the dimension of the generated code, there is no exponential growth in memory, either in compressed or uncompressed mode, because no use is made of primes factorization or calculations based on exponential functions.

In terms of coding and decoding performances, it may be possible to employ new generation optimized algorithms for the calculation and search of binomial coefficients in Pascal's triangle.

Regarding properties of the generated code, the code generated may be used as multi-use indexation system for at least one of the following examples: ordering lists of integers, routing architectures, data addressing and hashing, electronic identification and cryptography.

DETAILED DESCRIPTION

The person skilled in the art will appreciate that Pascal's triangle has many properties. In particular, for the enumeration of monomials of a homogeneous polynomial of degree m in n dimensions:

$$Cr(m, n) = \binom{m+n}{n} = \frac{(m+1)\ldots(m+n)}{n!}.$$

It is also to be noted that $Cr(m,n)=Cr(n,m)$ and consequently the following expression $Cr(r,r)$ is obtained for the central binomial coefficient of the line r, $Cr(r,r)$. Moreover, the sum of the binomial coefficients of this line is defined by:

$$\sum_{k=0}^{r} \binom{r}{k} = 2^r.$$

The calculation of a binomial coefficient from the binomial coefficients in the adjacent left column or from those in the oblique diagonal which is just above respectively yields:

$$\binom{r}{k} = \sum_{i=0}^{r-1} \binom{i}{k-1}, \binom{r}{k} = \sum_{i=0}^{r-1} \binom{k+i}{i}.$$

In addition, the recurrence formula for calculating a binomial coefficient by using its two above neighbors allows building a naive algorithm generating the Pascal's triangle, this formula being expressed as follows:

$$\binom{r}{k} = \binom{r-1}{k-1} + \binom{r-1}{k} \text{ avec } r \geq 1.$$

The pyramidal numbers are figurate numbers, i.e. decomposed, and represented by points distributed on regular polytopes. Pascal's triangle is formed from triangular, tetrahedral and generally hypertetrahedral numbers.

The disclosed system is designed from the idea of using combinatorial properties of Pascal's triangle and the algebraic properties of projective extensions in n-dimensions of the De Gua de Malves' analytic triangle, as a general system of indexing and coding for the lists of whole numbers. For this, the bijective correspondence between the monomials of a polynomial $P_{m,n}$ and the points of a lattice $T_{m,n}$ will be used. The monomial ordering of this polynomial will therefore be equivalent to the ordering of the lattice points. FIGS. 2A and 2B show the transition between the original triangle described by De Gua and this projective extension in two dimensions for a third degree curve.

Definition and Properties of Pyramidal Lattice

The individual skilled in the art will appreciate that a pyramidal lattice, directly related to the concept of pyramidal number, is both a combinatorial structure as well as an algebraic geometric structure in n-dimensions. Lattices are represented in the form of hyper-pyramids, such as the tetrahedrons of FIGS. 3A and 3B or the triangles of FIGS. 2A and 2B. A tetrahedral pyramid lattice, with the following mathematical notation $T_{m,n}$, corresponding to the line m+n and column m of Pascal's triangle, is associated to each binomial coefficient $$\binom{m+n}{m}.$$

It is therefore a hypertetrahedral projective configuration in n-dimensions with $$\binom{m+n}{m}$$

linearly dependent homogeneous points. The lattice points are arranged in a combinatorial manner, in sub-lattice of dimension n−1 and of degree ranging from 0 to m−1 (diagonal sum formula). Each lattice is located in the Pascal's triangle by means of the couple (m,n) or by the summation of all points of all previous lattices, what we call the global index. The number of points, i.e. the associated pyramidal number, is by definition equal to the number of monomials of a homogeneous polynomial of degree m in n dimensions. The projective homogeneous coordinates of the points of a lattice $T_{m,n}$ can be interpreted as the exponents of the monomials of an associated polynomial of degree m and dimension n. Each cell of the Pascal's triangle is associated with a hyper-pyramid, whose number of vertices is equal to the number located in the cell.

Monomial Ordering of Homogeneous Polynomials

A monomial $x_n^m$ from $x_0, x_1, \ldots, x_k$ is defined as the product $x_n^m = x_{n_0}^{m_0} x_{n_1}^{m_1} \ldots x_{n_k}^{m_k}$ and the total degree of $x_n^m$ is define as $|m| = m_0 + m_1 + \ldots + m_k$ if $vm = \langle m_k, m_{k-1}, \ldots, m_0 \rangle$ represents the vector of the exponents, and $vn = \langle n_0, n_1, \ldots, n_k \rangle$ represents the vector of the indices of variables where $n_0 \leq n_1 \ldots \leq n_k$.

The Euclidean definitions for monomial orderings of non-homogeneous polynomials are based on the notion of lexicographic order and on the total degree of monomials, i.e. the sum of the exponents of the variables. By combining these two paradigms, in particular, we obtain the lexicographic order, then the graded lexicographic order, then the graded reverse lexicographic order. In the case of homogeneous polynomials, all monomials by definition have the same total degree, and the ordering of monomials can be realized from two lexicographic orderings in a dual projective space, one using the exponents and the other the indices, (the monomials being represented in tensorial notation). In this case, the reverse lexicographic orderings are only variations of ascending and descending orderings.

Numeric order will be the name of the lexicographic order on the exponents such that $vm_\alpha >_{num} $ if and only if the left-most non-zero value of $vm_\alpha - vm_\beta$ is negative.

Numlex order will be the name of the numeric order on the exponents such that: $vm=\langle m_k, m_{k-1}, \ldots, m_0\rangle$ with $m_0 \leq m_1 \ldots \leq m_k$.

Combinatorial order will be the name of the numeric order on the exponents such that: $vm=\langle m_k, m_{k-1}, \ldots, m_0\rangle$ with $m_0 < m_1 \ldots < m_k$.

Lexicographic order will be the name of the lexicographic order on the indices of $\succ$ variables such that $vn_\alpha \succ_{lex} vn_\beta$ if and only if the left-most non-zero value is negative.

If the De Gua Malves polynomials in FIGS. 2A and 2B which corresponds to a Euclidean curve of the third degree is ordered in lexicographic order of its coefficients, we obtain the following sequence a, b·y, c·x, e·y$^2$, f·x·y, g·x$^2$, h·y$^3$, i·x·y$^2$, k·x$^2$·y, l·x$^3$.

After having replaced x by x0/x2 and y by x1/x2, taking the common denominator for all terms and finally keeping the numerators, the homogeneous representation of the polynomial is obtained:

a·x$_2^3$, b·x$_1$x$_2^2$, c·x$_0$x$_2^2$, e·x$_1^2$x$_2$, f·x$_0$x$_1$x$_2$, g·x$_0^2$x$_2$, h·x$_1^3$, i·x$_0$x$_1^2$, k·x$_0^2$x$_1$, l·x$_0^3$.

By choosing $vm_a=\langle 3, 0, 0\rangle$, $vm_b=\langle 2, 1, 0\rangle$ ... $vm_l=\langle 0, 0, 3\rangle$, it is possible to obtain the following sequences of monomials, first in reverse numeric order, and then in numeric order:

$\langle$a, b, c, e, f, g, h, i, k, l$\rangle$ $\langle$l, k, i, h, g, f, e, c, b, e$\rangle$.

By choosing $vn_a=\langle 2, 2, 2\rangle$, $vn_b=\langle 1, 2, 2\rangle$ ... $vn_l=\langle 0, 0, 0\rangle$, we obtain the following sequence in lexcograpic order:

$\langle$l, k, g, i, f, c, h, e, b, a$\rangle$.

Principles of Combinatorial Coding

By using combinatorial and projective properties of lattices, it is possible to define a general system for indexing the monomials of the polynomials and to simultaneously use it as the coding system for lists of natural numbers, i.e. the coordinates. The person skilled in the art will appreciate that by transposition of the integers in any alphanumeric codes, the coding system may be extended to encode text and strings of alphanumeric characters.

The disclosed system is therefore based on the following principles:

1. Each point of a lattice (m,n), also called a vertex of a hyper-pyramid, is associated with a vector with homogeneous coordinates of following type $[a_0:a_1: \ldots : a_n]$. The sum of the coordinates is equal to m. The position of a cell in Pascal's triangle and therefore of the hyper-pyramid and hyper-surface which are linked to it, is given by the row and column of Pascal's triangle. Lines and columns which are associated with a cell of Pascal's triangle correspond to the degrees and dimensions of the associated algebraic polynomials. Each vertex of the same pyramid, its supporting structure, has a signature formed of an equal number of coordinates whose sum represents the degree and the number itself the spatial dimension minus one. In combinatorial theory, this signature can be interpreted either as the projective coordinates of the vertex belonging to the pyramid or as the exponents of the monomials of the polynomial representing the associated hyper-surface, or even as the indices of the variables composing the monomials of this polynomial.
2. The vector whose homogeneous coordinates of type $[a_0:a_1: \ldots : a_n]$ is considered as the vector of exponents of a monomial of total degree m, belonging to a polynomial of degree m in n dimensions.
3. Each lattice is associated with a path covering the points in a determined order, also called indication of the indexing, these points being located on particular Hamiltonian paths which visit all the lattice points, according to an embodiment of the invention.
4. The local index of any monomial is considered the index of the homogeneous associated point, i.e. the rank of the point, as in the order in which the points of the selected path are visited.
5. According to one embodiment of the invention, any coordinate vector is encoded or decoded locally through the 3-tuple formed by the local index, total degree of the vector and the dimension (n+1).
6. According to one embodiment of the invention, any coordinate vector is encoded or decoded globally, with the total index obtained by adding the local index and the global index.
7. According to one embodiment of the invention, the notion of coordinate vector is extended to any set of natural numbers representing any kind of alphanumeric code.
8. The coding involves determining some bijective numbering systems or indexing systems for messages, by performing a double numbering, first in the Pascal's triangle, of the hyper-pyramid associated with the given message, i.e. the pyramid of support, and thereafter of the point-vertex of the pyramid whose signature represents the message. The integer or the n-tuple, generally the triplet of integers, resulting from this double numbering represents the encoded message in the indexed representation. The coding can be based on different methods of numbering and visiting points-vertices on the same pyramidal supporting structure and therefore the resulting code differs from one method to another.
9. The decoding involves determining from the code the supporting pyramid of the message first and then the signature of the point-vertex belonging to the pyramid. This double location can be done only by knowing a priori the chosen visiting method for numbering the points on the supporting pyramid.

Thus and as described below, it is possible to define a method for encoding of information, the method comprising of obtaining a list of integers to be encoded; determining a hyper-pyramid having a dimension adapted for encoding the integers list, the hyper-pyramid having a plurality of vertices such that the degree of the hyper-pyramid is equal to the sum of the integers in the list and that the dimension of the hyper-pyramid is equal to the number of the integers belonging to the list, minus one; realizing the indexing of the list of integers in this pyramid through an indexing system; and providing an indication of indexing in the hyper-pyramid.

In an embodiment, the integers list is obtained from a file. The individual skilled in the art will appreciate that various types of files can be used to store the list of integers.

It will also be appreciated that the step of providing the indexing of the integers list in the hyper-pyramid may include, in an embodiment, the storage of the indexing in a file. The individual skilled in the art will appreciate that various types of files can be used for storage.

Alternatively, it will also be appreciated that the step for providing the indexing of the integers list in the hyper-pyramid may include, in one embodiment, the transmission of the integers list to a processing unit via a network. The individual skilled in the art will appreciate that various types of networks can be used. In fact, the network may comprise at least one of following networks; local area network, metropolitan area network and wide area network. In one embodiment, the transmission will take place through the Internet.

It will also be appreciated that in one embodiment, an indication of indexing the list of integers in the hyper-pyramid includes displaying said indication on a screen.

The individual skilled in the art will appreciate that a method is described for decoding coded information using the previously described method to encode the information. In this case, the method will include the steps to obtain the indication of indexing the integers list in the hyper-pyramid. The method further includes the step of obtaining an indication of an indexing system used for generating said indication of the indexing list of integers in the hyper-pyramid.

This method will also include the step of determining by means of the indexing and of the indication of an indexing system used, said integers list, and finally, the step of providing that list of integers.

Figures 1A, 1B:
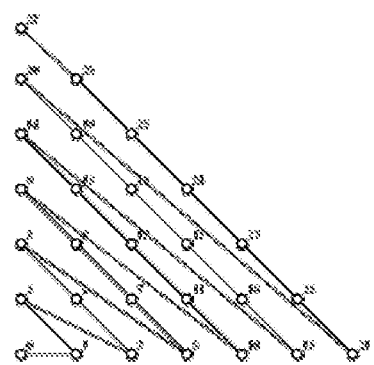
Figure 4:
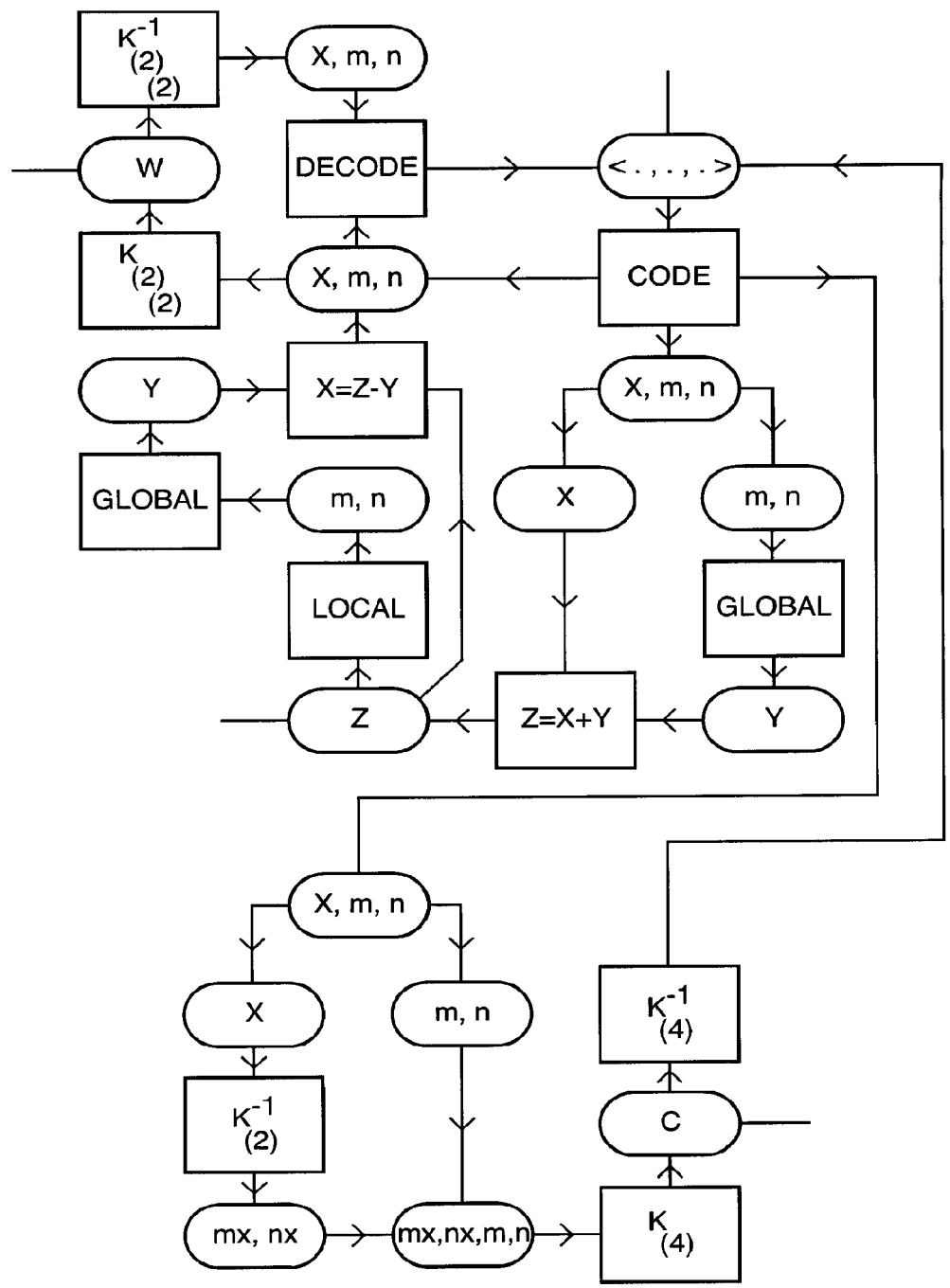
FIG. 4 illustrates an embodiment of the coding and decoding system.

The diagram of FIG. 4 illustrates an embodiment which allows providing of more options for encoding and decoding a list of integers <. , . . . , .>.

In particular, the CODE function is a family of coding functions that index the list of integers <. , . . . , .> with respect to the lattice $T_{m,n}$ where m is the total degree of the list and n−1 is its length. The result is a triplet <X, m, n>, X representing the integer corresponding to the index of the projective point which has the initial list of integers as input as its vector of homogeneous coordinates.

The person skilled in the art will appreciate that the calculated index is different depending on the encoding method adopted. Depending on the case, the triplet may be provided to the DECODE function which will return the original list or this list then separated into two parts to form a whole number Z which can be decoded by bijection without any other information.

The left part of the diagram in FIG. 4 shows another way to create a single integer W, allowing a bijective decoding. This is a family of functions noted $K_2$, which processes the pairing in two steps, first in pairing m and n, then in pairing the resulting integer value with X. Some decoding functions in two-dimensions, when applied successively, can then be used to restore the original code.

The right part of the diagram in FIG. 4 corresponds to a bijective encoding-decoding scheme coupled to a combinatorial compression mechanism. In this case, the triplet <X, m, n> is first converted to a quadruplet, the integer X being replaced by specific combinatorial coordinates mx and nx.

The quadruplet ⟨mx, nx, m, n⟩ then encoded by a four-dimensional encoding scheme in order to generate a code C. Such a bijective code can be decoded by a four-dimensional reverse decoding scheme.

The compression principle resides in the significant decrease of the polynomial function degrees between the quadruplet and the triplet, and this largely compensates for the increase of one additional character between the triplet and the quadruplet.

Indexing a lattice allows encoding the degree and the dimension of the lattice using a single integer. The indexing of a lattice $T_{m,n}$ can be performed by counting the number of cells in the Pascal's triangle which precede the cell with coordinates x=m and y=m+n corresponding to the binomial coefficient $$\binom{m+n}{m}.$$

Thus, we take the number of cells in the triangle preceding line m of the lattice, and add the degree of the lattice corresponding to its column is carried. The formula found corresponds to Cantor's indexing of the natural numbers in the Cartesian plane.

$$I_c = \frac{(m+n)*(m+n+1)}{2} + m$$

Global and Total Indexation

The global indexing ensures the bijective correspondence between the points of a lattice and their indexing in an n-dimensional space. Instead of calculating the number of cells preceding the binomial coefficient belonging to the lattice, the total number of points of all previous lattices is calculated. Using $$\sum_{k=0}^{r} \binom{r}{k} = 2^r,$$

and noting that $2^0 + \ldots + 2^r = 2^{r+1}$, the formulation of the global index $I_g$ is obtained by summing the number of lattice points from lines 0 to m+n−1 with the number lattice points of the line m+n going from 0 to m:

$$I_g = 2^{m+n} + \sum_{i=0}^{m-1} Cm(i, m+n-1).$$

The total number plus one of points preceding the lattice $T_{7,5}$ will be obtained as follows:

$I_g(5,2) \rightarrow (128-1)+(1+7+21+35+35)+(1)=227.$

The global index added to the local index, i.e. the rank of the point in the lattice, gives the total index of the point, which allows the retrieval of the encoded initial vector without storing the degree and dimension of the lattice. It should be noted that the bijective property of encoding and decoding mechanisms comes with a certain price in terms of size and computation time for the generated indices. On this last point, optimized versions of the GLOBAL and LOCAL algorithms will be presented further below as well as several methods for calculating the local index.

The person skilled in the art will appreciate, as illustrated in FIG. 5 in the GLOBAL algorithm, that the variable ind is equivalent to the total number of lattice points preceding the line of the $T_{m+n,m}$ lattice, and the variable acc is equivalent to the sum of the binomial coefficients on the line of the lattice. The LOCAL decoding function illustrated in FIG. 5 performs the reverse search by locating on Pascal's triangle the line preceding the lattice and then isolating the lattice on the line.

The different recursive formulations of the binomial coefficients allow us to consider the recursive trees calling functions as ordering systems for points of a lattice.

In all cases, the conditions for halting the recursion will be $$\binom{r}{k} = 1, k = r, \text{ or } \binom{r}{k} = 1, k = 0,$$

in which case the number of terminal leaves all equal to one will necessarily be equal to the desired binomial coefficient. FIG. 6 illustrates the recursive calls of functions corresponding to the following equations for calculating the binomial coefficient $$\binom{r}{k} = \sum_{i=0}^{r-1} \binom{i}{k-1}, \binom{r}{k} = \sum_{i=0}^{r-1} \binom{k+i}{i} \text{ and } \binom{r}{k}\binom{r-1}{k-1} + \binom{r-1}{k}$$

with $r \geq 1$, calculating the binomial coefficient $$\binom{4}{2}.$$

Binomial coefficients corresponding to each node of the tree provide the number of terminal leaves of their respective subtrees. Different algorithms for tree reading or traversal therefore provide indexing algorithms for terminal leaves. By establishing a correspondence between the production of terminal leaves and lattice points, it is possible to obtain an ordering of the latter. In particular, the deep traversal of trees involves processing the root of the tree and recursively traversing the left and right subtrees of the root. In the cases of prefixed or lexicographic depth traversal, the root is processed before the recursive calls on left and right subtrees.

Projective Positional Coding

The representation of numbers in positional notation is used to encode the sequence of homogeneous coordinates representing a point. Let N be the number, $a_i$ the symbol i and b the basis of numeration $$N = \sum_{i=0}^{n} a_i b^i \text{ with } 0 \leq a_i \leq b-1.$$

The basis of numeration m+1 is used, here m is the degree of the n-dimensional lattice, and $a_i$ is the homogeneous coordinate with rank i.

The positional index $I_P$ of the point belonging to the lattice with coordinate vector $[x_0: \ldots : x_n]$ is:

$$I_p = \frac{1}{m} \sum_{i=0}^{n} x_i (m+1)^{n-i} = \sum_{i=0}^{n} \left( x_i \sum_{j=1}^{n-i} \binom{n-j}{n} m^j \right) + 1.$$

FIG. 7 shows the example of the indexing of the two-dimensional cubic curves from FIGS. 2A and 2B. The indices are calculated in base-4. For example, the point [2:0:1] is represented by the index $$\frac{2.(4)^2 + 0.(4)^1 + 1.(4)^0}{3} = 11.$$

The maximum index of the lattice being equal to 16 for a total of 10 points, the figure shows a hollow indexing, i.e. having some integers missing in the numbering.

The person skilled in the art will appreciate that the hollow indexing phenomenon is one of the disadvantages of positional coding. Indeed, for a lattice $T_{m,n}$, the growth of the ratio $\rho_{m,n}$ between the maximum index $(m+1)^n$ of positional coding and maximum corresponding index for a combinatorial coding is:

$$\rho_{m,n} = \frac{(m+1)^n}{\binom{m+n}{m}} = \frac{n!(m+1)^{n-1}}{(m+2)(m+3)\ldots(m+n)}.$$

FIG. 8 illustrates representative curves of $\rho$ depending on the growth of m and n. These allow us to visualize the expansion of the number of digits required for positional coding. We obtain, for example, a value of $\rho_{10,10}$ equal to $$\frac{285311670611}{184756}.$$

The algebraic ring structure for polynomials allows to immediately show the additive homomorphism of positional coding with $I_P(A+B)=I_P(A)+I_P(B)$. Indeed, let us consider the points A with coordinates $[a_0: \ldots : a_n]$ and B with coordinates $[b_0: \ldots : b_n]$, using the properties of associativity and distributivity, it is possible to verify the following relationship:

$$I_P(A+B) = \frac{1}{m}\sum_{i=0}^{n} a_i(m+1)^i + \frac{1}{m}b_i(m+1)^i = \frac{1}{m}\sum_{i=0}^{n} (a+b)_i(m+1)^i.$$

These properties related to an additive homomorphism equally extend to linear combinations of the type $\lambda_0 A + \lambda_1 B$. The coding of point 11 in FIG. 7 is obtained from the linear combination of 1 and 16, with respective weights of 1 and 2 thus giving:

$$\frac{1.1 + 2.16}{1+2} \rightarrow 11;$$

$$\frac{1.[0:0:3] + 2.[3:0:0]}{1+2} \rightarrow [2:0:1].$$

Coding in Numeric Order

The definition of numeric order suggests a simple algorithm for computing the index of a projective point based on the counting, column after column, of the position of that point's coordinates. The leftmost nonzero difference in the exponent vectors of two projective points $vm_\alpha - vm_\beta$ being negative, one simply has to count from left to right, column after column, the index of each coordinate, and to then carry out the summation in order to find the final index of the point. For example, to calculate the index of the point [1:2:1:0] of the lattice $T_{4,3}$ in FIG. 11, fifteen zeros before the number 1 of the first column will be counted, four zeros with three number 1's before the number 2 of the second column and one zero before the number 1 of the third column. The index 23 or 11=(34−23) will be obtained according to the chosen indexing convention, i.e. ascending or descending.

It will be appreciated that the lattices $T_{m,n}$ are recursively decomposed into sub-lattice, $T_{m,n}, T_{m-1,n-1}, \ldots, T_{0,n-1}$, which involves the decomposition of the representative polynomial of a hypersurface into hypersurfaces polynomials of decreasing degrees in the lower dimensional space.

In addition, vectors of exponents are grouped in m+1 tables corresponding to monomials of polynomials representing the hypersurfaces of decreasing degree. FIG. 11 shows the decomposition by tables of a lattice (4.3). The last three columns represent exponent vectors of the lattices (4,2), (3,2), (2,2), (1,2) and (0,2).

Finally, the generated tables are, in turn, broken down into tables with lower dimension and so forth. The last two columns of the exponent vectors thus represent the monomials of homogeneous polynomials in 1 dimension.

$$I_n = \sum_{i=1}^{n} Cm\left(m - 1 - \sum_{j=1}^{i} vn[j], n + 1 - i\right).$$

The NUMORD algorithm, shown in FIG. 10, corresponds to the previous contracted equation. The second loop destined to accumulate iteratively the degree of the exponent vector is indeed absorbed within the first loop by instruction 4.

In order to simplify the programming code, the projective dimension equal to the vector length, minus one, is supplied as argument. By means of an example, FIG. 11 allows to visualize, step by step, the execution of the NUMORD function.

NUMORD([1,0,2,1,1,1],5)→{210}$_{num}$

The index $\{210\}_{num}^{5}$ is the result of the summation of pyramidal numbers performed at lines 1-6 of the algorithm in FIG. 10.

$$\left\langle \binom{9}{5}, \binom{8}{4}, \binom{5}{3}, \binom{3}{2}, \binom{1}{1} \right\rangle$$

This sequence shows the concept of pyramidal composition of the numeric index, illustrated using the table and Pascal's triangle in FIG. 11. The decoding of calculated indices, as presented earlier, will be essentially based on the principle of pyramidal decomposition of the proposed number, i.e. the search for the cascading sequence of the pyramidal numbers which composes it.

The following examples for indexing points belonging to lattices $T_{4,3}$, $T_{6,4}$, $T_{55,9}$, and $T_{54,9}$ illustrate in particular the non bijective nature of the numeral coding.

NUMORD([1,2,1,0],3)→{11}$_{num}$

NUMORD([4,0,1,0,1],4)→{11}$_{num}$

NUMORD([1,2,3,4,5,6,7,8,9,10],9)→ {22724037001}$_{num}$

NUMORD([0,2,3,4,5,6,7,8,9,10],9)→ {22724037001}$_{num}$

| i | x[i] | ind | m | n |
|---|------|-----|---|---|
| 1 | 1 | 84 | 6 | 5 |
| 2 | 0 | 14 | 5 | 4 |
| 3 | 2 | 4 | 5 | 3 |
| 4 | 1 | 1 | 3 | 2 |
| 5 | 1 | 0 | 2 | 1 |

Decoding in Numeric Order

The decoding algorithm is based on reversing the indexing process featured in lines 1 to 6 of the NUMORD function. The objective for calculating the numeric signature vm of the exponents is to first find the successive pyramidal numbers that were used to calculate the Numeric index. To find the greatest pyramidal number used in the composition $I_m^{num}$, we must look for the largest pyramidal number which is less than or equal to it in column m of Pascal's triangle. Once this number is found along with his rank in the column, the first exponent of the sought signature is obtained and this is done from column to column by decreasing each time the starting index. These steps are illustrated by the table above with the calculation of the numeric signature $\{210\}_5$. The last exponent of the signature is calculated simply by subtracting the sum of the exponents found from the degree of the index.

The following examples illustrate the enumeration of $T_{4,3}$, lattice points from FIG. 11, indexed from 0 to 34=Cr(4,3)−1, and the enumeration of the lattice points in FIGS. 2A and 2B, indexed from 0 to 9=Cr(3,2)−1.

ORDNUM([34−k,4,3])→[0,0,0,4],[0,0,1,3], . . . [4,0,0,0], k=0, . . . , 34

ORDNUM([9−k,3,2])→[0,0,3],[0,1,2], . . . [3,0,0], k=0, . . . , 9

Coding in Lexicographic Order

In order to perform coding in lexicographic order, the lattice is decomposed into sub-lattices $T_{m-1,n-1}$, $T_{m-1,n-2}$, . . . , $T_{m-1,0}$, which is equivalent to decomposing the representative polynomial of a hypersurface into polynomials of hypersurfaces having lesser degrees and belonging to lesser dimensions. Next, the vm index vectors are grouped into n tables corresponding to monomials of polynomials representing hypersurfaces of decreasing degree. FIG. 13 shows the decomposition by tables of the lattice $T_{4,3}$. The 4 tables respectively correspond to lattices $T_{3,3}$, $T_{3,2}$, $T_{3,1}$, and $T_{3,0}$, belonging to cubics in dimensions n= 3, . . . , 0. Finally, generated tables are in turn broken down into lower degree tables in decreasing dimensions.

$$I_l = \sum_{i=0}^{m-1} C_n(m - i, n - 1 - vm[i + 1])$$

FIG. 13 illustrates the block decomposition of a lattice (4, 3). The signatures of length 4 beginning with either $x_0$, $x_1$, $x_2$, or $x_3$ form four blocks with $$\binom{4+3-1}{3} = 20, \binom{4+2-1}{2} = 10,$$

$$\binom{4+1-1}{1} = 4, \text{ and } \binom{4+0-1}{0} = 1$$

as their respective sizes. The signature vm=⟨1,1,2,3⟩ has the following for index:

C(4,(3−1)−1)+C(3,(3−1)−1)+C(2,(3−1)−2)+ C(1,(3−1)−3)={10}$_{lex}$.

The execution of the LEXORD([0,1,1,2],4,3)→{23}$_{lex}$ function is shown in the following table:

| i | acci | m-i | d-vm[i + 1] | Comb (m, d-i + 1) |
|---|------|-----|-------------|-------------------|
| 0 | 15 | 4 | 2 | $\binom{6}{2} = 15$ |

| i | acci | m-i | d-vm[i + 1] | Comb (m, d-i + 1) |
|---|------|-----|-------------|-------------------|
| 1 | 19   | 3   | 1           | $\binom{4}{1}=4$  |
| 2 | 22   | 2   | 1           | $\binom{3}{1}=3$  |
| 3 | 23   | 1   | 0           | $\binom{1}{0}=1$  |

The LEXORD algorithm is described in FIG. 14.

Decoding in Lexicographic Order

The ORDLEX algorithm which allows to perform decoding in lexicographic order is described in FIG. 15.

The following examples illustrate the enumeration of the lattice points of FIG. 13, indices . . . then the enumeration of the lattice points in FIG, indices . . . .

ORDLEX([34−$k$,4,3])→[0,0,0,0],[0,0,0,1], . . . [3,3,3,3], $k$=0, . . . ,34.

ORDLEX([9−$k$,3,2])→[0,0,0],[0,0,1], . . . [2,2,2], $k$=0, . . . ,9.

Gray's Projective Encoding

The sum of the variations between consecutive codes generated for numeric encoding is non constant. For example, the sum of the variations between the codes 34 and 33 of the lattice $T_{4,3}$ is equal to $\langle 0, 0, 0, 4 \rangle - \langle 0, 0, 1, 3 \rangle \to 0$ while being equal to $\langle 0, 0, 4, 0 \rangle - \langle 0, 1, 0, 3 \rangle \to 1$ between the codes 30 and 29. Gray's projective encoding eliminates these differences of variations, and generally removes the jumps between non-consecutive points a lattice. The distance between these points on the lattice is in fact greater than one. The principle of projective Gray encoding is essentially a substitution of subtrees having an odd indexing by their symmetric in the recursive tree. This replacement being recursive, the operation will be repeated for each leaf, as long as its successive parents will have an odd indexing. Therefore, sub-trees with an even number of successive odd parents will not have to be changed, two symmetric substitutions cancelling each other out.

It will be appreciated that in projective Gray coding, the sum of the exponents of the $V_{n_{i+1}} - V_{n_i}$ vector obtained from two consecutive points is null, and the Hamming distance between two consecutive exponent vectors is equal to 2.

FIG. 16 illustrates a projective Gray coding for the lattice (4,3).

The algorithm shown in FIG. 17 is a modified version of the algorithm illustrated in FIG. 10. Line 4 tests the parity of each exponent of the input signature (type 0 function). In the case of an odd exponent, the indexing is reversed on line 7 and the variable s changes sign. Its value being equal to 1 or −1 allows taking into account the even or odd number of already processed exponents, and thus identifying sub-trees with an even number of the successive parents with odd parity, who then do not need be changed.

FIG. 18 illustrates the path of the $T_{4,3}$ lattice points in projective Gray coding. The different sections show a succession of paths, which will be named boustrophedon Cantor paths. The indexing in projective Gray coding of the point 10 for the lattice $T_{6,4}$ and the lattice $T_{2,4}$ is obtained as follows:

GRAORD([4,0,1,0,1],4)→{10}$_{gra}$;

GRAORD([0,0,1,0,1],4)→{10}$_{gra}$.

Projective Gray Decoding

An implementation of Gray's projective decoding algorithm is illustrated in FIG. 19 by the ORDGRA function.

The following example illustrates the enumeration of $T_{4,3}$ lattice points from FIG. 16 indexed from 0 to 34=Cr(4,3)−1:

ORDGRA([34−$k$,4,3])→+[0,0,0,4], . . . [3,0,0,1],[4,0,0,0], $k$=0, . . . ,34.

Direct and Dual Transcoding

It will be appreciated that the operation of transcoding a coding system to another, can be achieved by changing any of them, by simple conversion between the exponent vector Vn and the coordinate vector Vm, or by a direct equivalence between indexing functions. In the first case, we shall be speaking about dual transcoding, performed by two functions, VN2VM and VM2VN, and we shall have the following equivalences formed from the lexicographic and Numeric signatures:

$S_{num}[Cm(m,n)-i]=VmVn(S_{lex}[i-1]);$ $S_{lex}[Cm(m,n)-i]=VnVm(S_{num}[i-1]).$ For example, if:

$S_{num}[Cm(7,4)-168]=[1,1,4,1,0]$ et $S_{lex}[168-1]=[0,1,2,2,2,2,3]$, il sera obtenu:[1,1,4,1,0]←VM2VN([0,1,2,2,2,2,3]).

Transcoding between vectors is shown in FIG. 20.

Recursive Production of an Ordering

Given the symmetry of Pascal's triangle $$\binom{r}{k}=\binom{r}{r-k}$$

and the equivalences between the recursive decompositions by column and diagonal, a recursive tree is associated with two symmetric binomial coefficients. FIG. 21 shows the recursive structure $$\binom{6}{4}$$

identical to that of $$\binom{6}{2}.$$

The nodes a(i,j) are indexed with width i and depth j and number of leaves of the corresponding subtrees are directly calculated from i and j. Any function I(i,j) then allows labeling of the tree nodes and produces a type of ordering for the terminal leaves of the tree. If one opts for the same tree traversal both lexicographic and prefix, we then obtain the indexing in Numeric order for a quartic curve in two dimensions $$\binom{6}{4},$$

or the indexing in lexicographic order of an hyperquadric in four dimensions $$\binom{6}{2}$$

or finally the indexing in lexicographic order of 4-combinations without repetition for 6 objects. The recursive generation of an ordering therefore ends up associating with a binomial coefficient, a triplet consisting of a traversal order of the recursive tree, a function for indexing the nodes of the tree and finally a selection of the combination type with or without repetitions.

Indexing Functions of Recursive Trees

The Numeric indexing, i.e. Numlex and combinatorial functions, may be derived sequentially from one another. The resulting geometric interpretation uses transformations between projective, affine and Euclidean spaces.

Numeric and Numlex Orderings

The algorithm for the Numeric index consists of incrementing the indices of the nodes having the same level, starting from zero, as long as they have the same parent. Hence, the traversal of the tree is realized from left to right and from top to bottom. The index of the last level is obtained by deducting the sum of the indices of the previous levels of the degree of the tree, which ensures the homogeneity of the produced numeric points. To move from numeric encoding space to numlex encoding space, we must use transition matrices $N2X_n$ that match the vertices of simplexes of numeric projective spaces with the vertices of projective subspaces with monotonically increasing sequences for coordinates. For example, the vertex [1:0:0:0] of a 3-dimensional projective simplex is associated with the vertex [1, 1, 1, 1]. The matrix multiplication of an n-dimensional projective point with the matrix $N2X_{n-1}$ generates in all cases a point with increasing coordinates. Noting $X2N_n$ the matrix inverse which allows going from a NUMLEX space to a numeric space, the following transition matrices will be obtained.

$$N2X = \begin{bmatrix} 1 & 1 & 1 & \ldots & 1 \\ 0 & 1 & 1 & \ldots & 1 \\ 0 & 0 & 1 & \ldots & 1 \\ \vdots & \vdots & \vdots & \ddots & \vdots \\ 0 & 0 & 0 & \ldots & 1 \end{bmatrix}, X2N = \begin{bmatrix} 1 & -1 & 0 & \ldots & 0 \\ 0 & 1 & -1 & \ldots & 0 \\ 0 & 0 & 1 & \ldots & 0 \\ \vdots & \vdots & \vdots & \ddots & \vdots \\ 0 & 0 & 0 & \ldots & 1 \end{bmatrix}$$

For example, the Numeric projective point $[\alpha_0:\alpha_1:\alpha_2:\alpha_3]$ will therefore transformed into a NUMLEX point $[\alpha_0,\alpha_0+\alpha_1,\alpha_0+\alpha_1+\alpha_2,\alpha_0+\alpha_1+\alpha_2+\alpha_3]$ by the matrix product with the matrix $N2X_3$. The point [5:2:0:4] will in turn transformed into the NUMLEX point [5:7:7:11] and his lexicographic index will be calculated from its coordinates as follows:

$$\binom{4+(11-1)}{4} + \binom{3+(7-1)}{3} + \binom{2+(7-1)}{2} + \binom{1+(5-1)}{1} =$$
$$1001 + 84 + 28 + 5 = 1118.$$

Numeric and Combinatorial Orders

We move from the Numeric order to the combinatorial order by performing a linear combination between the NUMLEX points and the point [0, 1, 2, . . . , n−2, n−1]. This is equivalent to adding each coordinate of the NUMLEX point with his rank, equivalent to the level in the recursive tree. FIG. 24 illustrates the presence of the combinatorial subspace for 3-combinations for the unit simplex in projective space in three dimensions.

This subspace is represented by the vertices of its own simplex, obtained by projective linear transformation of the vertices belonging to the unit simplex in the projective starting space. The following linear transformation is obtained:

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \rightarrow \begin{bmatrix} 1 & 2 & 3 & 4 \\ 0 & 2 & 3 & 4 \\ 0 & 1 & 3 & 4 \\ 0 & 1 & 2 & 4 \end{bmatrix}.$$

The points belonging to the combinatorial space and obtained by any combination of two of the vertices of the simplex have therefore coordinates belonging to a strictly increasing sequence. It is possible to establish the following equivalence theorem:

The indexing of a k-combination for an r-alphabet $\{0, \ldots, r-1\}$ is equivalent, by projective transformation, to the numeric indexing of the lattice $T_{r-k,k}$.

FIG. 25 illustrates the numeric indexing of a lattice $T_{2,3}$ equivalent to the indexing of $$\binom{5}{3}$$

3-combinations from an 5-alphabet 0, . . . , 4. In higher dimensions, for example, the 2172 numeric point with the following coordinates [2, 4, 1, 2, 0, 3] belonging to the lattice $T_{12,5}$ is converted into numlex point [2, 6, 7, 9, 9, 12] by multiplication with the matrix $N2X_5$, and is then added with the point [0, 1, 2, 3, 4] to give the combinatorial point [2, 7, 9, 12, 13, 17]. It is possible to verify that the position of the combination [2, 7, 9, 12, 13] for the alphabet ⟨0, 1, . . . , 17−1⟩ is indeed $$2172 = \binom{17-3}{5} + \binom{17-8}{4} + \binom{17-10}{3} + \binom{17-13}{2} + \binom{17-14}{1}.$$

The equivalence between the Numeric and combinatorial algorithms enables to use the ORDNUM numeric coding, as fast algorithms allowing the generation of combinations. Those above, particularly, are based on enumerative algorithms of type $HAKMEM_{175}$ (R. Schroeppel, M. Beeler, R. W. Gosper. Hakmem. Technical report, Massachusetts Institute of Technology, 1972), which allow to generate a new combinations from the previous combination, represented in binary form. Because this type of algorithm, to generate the combinations, enumerates in ascending order, the numbers having the same number of bits 1 in their binary representation, the result is that the optimized algorithm ORDNUM can also be used for this purpose. FIG. 26 illustrates the enumerative generation of projective points for a lattice $T_{2,3}$ corresponding to a 3-dimensional quadric. The 10 points, by projective transformation in combinatorial subspace, form the 3-combinations taken from a set of 5 in the alphabet 0, . . . , 4. The relationship with the binary representation of combinations calculated with the HAKMEM algorithm ensues with a transposition of the indices for the combinations listed in a decreasing order in the direction of reading.

Numeric and Cantor Orders.

Using the previous results, it is possible to transcode the Cantor's coding from the numeric coding by moving from the projective space to Euclidean space. Using the matrix notation, the transformation from a numeric point $[\alpha_0:$ $\alpha_1 : \ldots : \alpha_n]$ of projective space into Euclidean space is in fact made by the product of this point by the transition matrix P2E where $|\alpha|$ is the degree of the point. The matrix E2P will allow the reverse operation to go from Euclidean space to projective space:

$$P2E = \begin{bmatrix} 1 & 0 & 0 & \ldots & \frac{1}{|\alpha|} \\ 0 & 1 & 0 & \ldots & \frac{1}{|\alpha|} \\ 0 & 0 & 1 & \ldots & \frac{1}{|\alpha|} \\ \vdots & \vdots & \vdots & \ddots & \vdots \\ 0 & 0 & 0 & \ldots & \frac{1}{|\alpha|} \end{bmatrix}, E2P = \begin{bmatrix} 1 & 0 & 0 & \ldots & -1 \\ 0 & 1 & 0 & \ldots & -1 \\ 0 & 0 & 1 & \ldots & -1 \\ \vdots & \vdots & \vdots & \ddots & \vdots \\ 0 & 0 & 0 & \ldots & |\alpha| \end{bmatrix}.$$

The result is the following homogeneous point:

$$\left[\alpha_0 : \alpha_1 : \ldots : \frac{(\alpha_0 + \alpha_1 + \ldots + \alpha_n)}{|\alpha|}\right] \equiv [\alpha_0 : \alpha_1 : \ldots : \alpha_{n-1} : 1].$$

The Euclidean point obtained by eliminating the last coordinate equal to 1, $[\alpha_0 : \alpha_1 : \ldots : \alpha_{n-1}]$ is then the point of Cantor in the n−1 dimension. Therefore, an equivalence is established, between the Cantor coding of the reverse list $K(x_k, \ldots, x_1)$ and the numeric encoding. To do so, it will be noted that the Cantor recursive tree is obtained by removing the last level of the numeric recursive tree, i.e. the level that allows the homogeneous representation of the numeric point.

$$K(x_n, \ldots, x_1) = I_{num}(x_1, \ldots, x_n) + \binom{m+n-1}{n}, m = \sum_{i=1}^{n} x_i.$$

By continuing the example:

$K(1, 3, 2, 4) \rightarrow$ $$\binom{10+4-1}{4} + \binom{6+4-2}{3} + \binom{4+4-3}{2} + \binom{1+4-4}{1} = 782,$$

it is possible to check that $$I_{num} = 67 + \binom{10+4-1}{4} = 782.$$

It should be noted that the first term of the equation:

$K(1, 3, 2, 4) \rightarrow$ $$\binom{10+4-1}{4} + \binom{6+4-2}{3} + \binom{4+4-3}{2} + \binom{1+4-4}{1} = 782$$

must be subtracted to obtain an indexing of the lattice points in the range between 0 and the total number of points. The equation $$\binom{r - a_i}{k} = \binom{m - 1 - \sum_{j=1}^{i} vn[j]}{n + 1 - i}$$

is used to obtain the second equivalence $K(x_n, \ldots, x_2) = I_{num}(x_1, \ldots, x_n)$, which establishes a relationship between the Cantor encoding for a list, the numeric encoding of the reverse list preceded by any integer. This equivalence is illustrated by the following example which allows to find the Cantor coding $K_3$ from the function NUMORD([x0, x1, x2, x3], 3) used in symbolic mode:

$$K_3 = \frac{m_0}{1} + \frac{m_1(m_1 + 1)}{2} + \frac{m_2(m_2 + 1)(m_2 + 2)}{6};$$

with $m_0 = x3, m_1 = m_0 + x2, m_2 = m_1 + x1$.

Taxonomy and Hamiltonian Order

Previous equivalences allow to establish a taxonomy of the coding systems which correspond to different orders of indexing. FIG. 28 shows the numlex orders, and combinatorial as special cases of numeric order, while the Cantor order is itself a special case of the combinatorial order. It is possible to extend this classification by introducing a Hamiltonian order which will also include the order of projective Gray, himself regarded as a generalization of the Cantor boustrophedon order. New orders based on spiral curves filling the space will be described below.

Searching Hamiltonian Chains on the Lattice

The person skilled in the art will appreciate that the local indexing for a lattice depends on the type of visiting path for all its points. Some of these methods include in particular those associated with the theory of space-filling curves.

Spiraled Cartesian Pairing Function

The function of spiral pairing shown in FIG. 31 allows indexing of integer pairs. The Cartesian plane is traversed in a spiral manner as illustrated in FIG. 31. In this case, polynomials for indexing the pairs of coordinates in the coordinate plane must be searched.

It will be appreciated that the generation of the spiral takes place iteratively by means of a 45 degree set square, turned of π/2, then changed of scale, then translated of one unit, so as to ensure the continuity of the curve.

$$Z(x, y) = \begin{cases} 4x^2 - 3x + y & si\ x > 0\ et\ |y| <= |x| \\ 4y^2 - y - x & si\ y > 0\ et\ |x| <= |y| \\ 4x^2 - x - y & si\ x < 0\ et\ |y| <= |x| \\ 4y^2 - 3y + x & si\ y < 0\ et\ |x| <= |y| \end{cases}$$

Point 44 has 6 as integer square root, which corresponds to the sixth set square of the spiral having the point 36=6.6 as a vertex. The point 44 is located between the vertex 36 (even square) and the following vertex 49 (odd square). Being greater than the angular intermediate point 42=7.6, it is located on the lower horizontal section of the spiral. The variables i and j are then calculated from the angular intermediate point 42, i is therefore calculated from the formula for the index of the lower left corner of the spiral $I_{Bg} = 2i(2i+1) = 42$, i=3 and j is calculated from the difference between the given number and the lower left index, i.e. j=44−42=2. The calculation of the pair [x,y] is completed by bringing the values i and j in the preceding formulas j=x+i and i=−y. The final result is [x,y]=[j−i,−i]=[−1,−3]. The following example illustrates the use of both encoding and decoding functions SPIORDc and ORDSPIc, using the spiral manner in the Cartesian plane.

SPIORDc([−1509123456789,82739987654321])→
{27383622228148684752295686632}$_{s}e$

ORDSPIc(27383622228148684752295686632)→
[−1509123456789,82739987654321]

Affine Function for the Spiral Pairing

FIG. 32 describes an implementation of an algorithm SPIORDc for Cartesian encoding and ORDSPIc for Cartesian spiral decoding.

$$Z(x, y) = \begin{cases} \dfrac{y(9y-7)}{2} + x & \text{if } y < 0 \text{ and } x <= 2y \\ \dfrac{x(9x-7)}{2} + y & \text{if } x > 0 \text{ and } y <= 2x_o \\ \dfrac{(9(x-y)^2 - x - y)}{2} & \text{otherwise} \end{cases}$$

FIG. 33 describes an implementation of an encoding algorithm SPIORDa and of the decoding algorithm ORDSPIa, both using the spiral manner in the affine plane.

Projective Function of Spiral Pairing

It is possible to construct a spiral order in n dimensions by recursively defining some chains of chains of spiral curves, the first spiral curves being one-dimensional, then two-dimensional and so on. FIG. 34 shows a spiral order of a lattice (6,4) for a sextic surface in 3 dimensions. The junctions between the two-dimensional spirals which are stacked, are alternated, sometimes between the beginnings and sometimes between the ends of the spirals. To obtain spiral chains in four dimensions, we must glue together spiral lattices in 3-dimensions, first with a point, then a lattice (0,4) then a lattice (1,4), then a lattice (2,4), etc.

Optimizations for Calculating Binomial Coefficients

The person skilled in the art will appreciate that fast calculation of binomial coefficients is essential in all encoding and decoding functions presented herein. The recursive or iterative functions based on the simple relations attached to the Pascal's triangle are excellent candidates for the fast calculation of binomial coefficients of a small size. They are no longer sufficient for calculations involving large integers and should be improved or replaced. It is the reason why optimized versions and algorithmic improvements, essential to reducing computational time will be presented below.

Recursive Formulation

The recursive formulation of additive type $$\binom{r}{k} = \binom{r-1}{k-1} + \binom{r-1}{k} \text{ with } r \geq 1$$

is the basis for the construction of Pascal's triangle. In this case, the recursive binary tree has many associated redundant branches and has a maximum depth of r−1. These properties give to the algorithm a time complexity of order equivalent to the binomial coefficient $$\binom{r}{k}$$

itself. Consequently, the computation time becomes immediately prohibitive and can be only controlled by using call tables that store the called functions, their arguments and results. This mechanism of optimization borrowed from the theory of compilation is contained in particular in the MAPLE symbolic language and can break the computational complexity by eliminating redundant calls present in the recursive calculation of binomial coefficients or also in the Fibonacci numbers. By passing to an additive-multiplicative generalizing formula $$\binom{r}{k} = \binom{r-1}{k-1} + \binom{r-1}{k} \text{ with } r \geq 1,$$

a new recursive formulation of maximum depth r−k which minimizes redundant calls, will be presented. It will be shown that this approach can be considered as a variant of the optimized recursive version for the Vandermonde convolution. Applying formula $$\binom{r}{k} = \binom{r-1}{k-1} + \binom{r-1}{k} \text{ with } r \geq 1$$

repetitively on the binomial coefficients of the isosceles rectangle triangle, with sides of dimension equal to d, the following relation is obtained:

$$\binom{r}{s} = \sum_{i=0}^{k \leq s} \binom{r-k}{s-i} \binom{k}{i}.$$

The latter is obtained by observing, as shown in FIG. 35, that the binomial coefficient to the lower tip of the triangle may be calculated from the binomial coefficients of any of the above lines. This can be done by multiplying the binomial coefficients of this line with a suitable scaling factor, for example a0=1·d0+3·d1+3·d2+1·d3. These multiplicative factors due to redundancy of the binary recursive formula 8 which is applied line by line, and one binomial coefficient after the other, are simply the binomial coefficients of the expansion of (x+y). FIG. 34 shows the binary tree for the application of the formula $$\binom{r}{k} = \binom{r-1}{k-1} + \binom{r-1}{k} \text{ with } r \geq 1$$

on the four sides of a triangle. The successive duplications of the binomial coefficients provide the suites of the following multiplicative factors {1}, {1, 1}, {1, 2, 1}, {1, 3, 3, 1} and the following equalities a0=1·a0, a0=1·b0+1·b1, a0=1·c0+2·c1+1·c2, a0=1·d0+3·d1+3·d2+1·d3. By putting s=k in the formula $$\binom{r}{k} = \binom{r-1}{k-1} + \binom{r-1}{k} \text{ with } r \geq 1,$$

the following recursive intermediate form is obtained.

$$\binom{r}{k} = \sum_{i=0}^{k} \binom{r-k}{k-i} \binom{k}{i}.$$

To ensure the existence of a right triangle associated with each binomial coefficient of Pascal's triangle, the leftmost symmetric coefficient on a line must be maintained using the symmetry property of binomial coefficients $$\binom{r}{k} = \binom{r}{r-k}.$$

The following equation is then obtained for k≤r:

$$\binom{r}{k} = \sum_{i=0}^{k} \binom{r-k}{\min(k-i, r-k-(k-i))} \binom{k}{\min(i, k-i)}.$$

The latter may ultimately be considered as a variant of the optimized recursive Vandermonde convolution which is expressed by:

$$\binom{p+q}{c} = \sum_{k=0}^{c} \binom{p}{c-k}\binom{q}{k}.$$

The algorithm of FIG. 37, uses three halt conditions depending on the values of k. They were deinterleaved for easier reading of code. From the point of view of theoretical programming, the algorithm also works without using the min( ) function useless in the classic formulation of Vandermonde, but useful in the reduction of recursive calls.

By performing the following successive substitutions k=i, c=k, q=k, and r=p+k we obtain equivalences between the relations $$\binom{r}{k} = \sum_{i=0}^{k} \binom{r-k}{k-i}\binom{k}{i} \text{ and } \binom{p+q}{c} = \sum_{k=0}^{c} \binom{p}{c-k}\binom{q}{k}$$

and then between the relations $$\binom{p+q}{c} = \sum_{k=0}^{c} \binom{p}{c-k}\binom{q}{k} \text{ and } \binom{r}{k} =$$

$$\sum_{i=0}^{k} \binom{r-k}{\min(k-i, r-k-(k-i))}\binom{k}{\min(i, k-i)}.$$

FIG. 35 shows the different possible convolutions among the lines of Pascal's triangle, with the recursion which starts from the pair of lines $\{r-k, k\}$, i.e. $\{6,3\}$. To be able to use in the Vandermonde convolution, the intermediate lines between the lines r−k and k, it would be necessary to choose a pair $\{r-k-i, k+i\}$ which verifies $$\frac{r-2k}{2} \geq i \geq 0$$

and therefore introduce an integer division by 2 in the recursion algorithm. In this example, we should have consequently i=1 there will be and thus the opportunity to start the recursion in the modified algorithm with the couple of lines $\{5,4\}$.

Iterative Formulations

There are three iterative formulations to calculate the binomial coefficients from additions, subtractions, multiplications and divisions. It will be appreciated by the person skilled in the art that the formulation by column is in all basic algorithmic implementations.

$$C_y(m, n) = \prod_{i=1}^{n} (m+i)/i.$$

However the formulation per line is mainly used for the calculation of the binomial expansion of Newton:

$$C_x(m, n) = \prod_{i=1}^{m} (m+n+1-i)/i.$$

Finally, the formulation is based on the diagonal symmetry property of binomial coefficients for repetitions.

$$C_d(m, n) = C_y(n, m) = \prod_{i=1}^{m} (n+i)/i.$$

FIG. 38 illustrates an embodiment of a computing algorithm of binomial coefficients by row XENUME and by column YENUME.

The binomial coefficient $$\binom{9}{6} = 84$$

will be obtained after the sixth iteration, by $C_y(6,3)$ in column 3, at the end of the sequence YENUME(3,9)→⟨1, 4, 10, 20, 35, 56, 84⟩ or alternatively after the fourth iteration through $C_x(6,3)$ in the line 9, at the end of the sequence XENUME(3,9)→⟨1, 9, 36, 84⟩. The computation time proportional to the iterations leads generally to perform fast calculation using the function $C_x$ in the case where m>n by means of $C_y$ only if m≤n. This calculation may ultimately be realized by the function $C_d$ that requires the same number of iterations as $C_x$ by construction of Pascal's triangle. The sequence to obtain the binomial coefficient $$\binom{9}{6} = 84$$

will thus be ⟨1, 7, 28, 84⟩. The generalization of this example therefore leads to use the symmetry property for the optimization of the number of iterations of the binomial coefficient and to use in both cases a single function for the calculation:

$$C_r(m, n) = \begin{cases} C_y(m, n) & \text{if } m > n \\ C_y(n, m) & \text{if } m \leq n \end{cases}.$$

This optimization of the first number of iterations being made, it is possible to further reduce this number by half by putting the equation $$C_y(m, n) = \prod_{i=1}^{n} (m+i)/i$$

in the form of a product of difference of two squares. For a given product, having an odd number 2k+1 of terms, $$\frac{(m+1)}{1} \frac{(M+2)}{1} \cdots \frac{(m+2k)}{2k} \frac{(m+2k+1)}{2k+1}$$

after performing the change of variables m=M−k−1, we obtain $$\frac{(M-k)}{1}\frac{(M-k+1)}{2}\cdots\frac{M}{k+1}\cdots\frac{(M+k-1)}{2k}\frac{(M+k)}{2k+1}.$$

By grouping all terms with the exception of M as the difference of two squares:

$$\frac{(M)}{1}\frac{(M^2-1^2)}{2.3}\frac{(M^2-2^2)}{4.5}\cdots\frac{(M^2-k^2)}{2k\cdot(2k+1)}.$$

The same operation is obtained for a product having an even number 2k of terms and so it is obtained:

$$\frac{(M)}{1}\frac{(M-k)}{1}\frac{(M^2-1^2)}{2.3}\frac{(M^2-2^2)}{4.5}\cdots\frac{(M^2-(k-1)^2)}{2k\cdot(2k+1)}.$$

By dividing at each iteration, by 2i(2i+1), the algorithm of the function for the optimized algorithm of the binomial coefficient calculation is then presented in FIG. 39.

Deferred Divisions

Depending on the performances of the multiplication and division, it is possible to envisage variants of previous algorithms, by deferring and limiting the exact divisions. Simply independently calculate denominators that are factorials and divide by the result at the end of algorithms or intermediately if you want to control the expansion of large integers during the computation. This approach is also useful in designing parallel algorithms.

FIG. 39 illustrates an embodiment of a computation algorithm by means of product of differences of squares.

Calculation by Dynamic Programming

The calculation of binomial coefficients can be performed without multiplication and division using the recurrence pattern $$\binom{r}{k}=\binom{r-1}{k-1}+\binom{r-1}{k}$$

and by means of the storage memory. The necessary operations are the addition and the assignment, and the number of steps required to calculate a binomial coefficient is mn+½(m(m+3))+n+1.

The principle is that a calculation scheme of binomial coefficients be established and shall be based on a horizontal rectangular representation of Pascal's triangle. The evaluation of the binomial coefficients is then done column by column rather than row by row. The algorithm used thus consists in visiting the cells of only one rectangle as shown in FIG. 40B. The desired binomial coefficient is located at the tip of the rectangle and is calculated from the binomial coefficients of the preceding columns.

An implementation of the dynamic programming algorithm is illustrated in FIG. 41.

Additive and Multiplicative Method

By using the multiplication operator, it is possible from the rectangular representation of Pascal's triangle to develop methodologies for calculating binomial coefficients based on fast exponentiation of particular triangular matrices. For this purpose, we use the binomial theorem of Newton extended to the square commutative matrices, namely $(M+I)^r$ where I is the identity matrix. The application of the formula is used to express the powers of triangular matrices filled only with 1's, from matrices expressed in terms of binomial coefficients, and we obtain $$M = \begin{bmatrix} 1 & 0 & 0 & \cdots & 0 \\ 1 & 1 & 0 & \cdots & 0 \\ 1 & 1 & 1 & \cdots & 0 \\ \vdots & \vdots & \vdots & \ddots & \vdots \\ 1 & 1 & 1 & \cdots & 1 \end{bmatrix}^{m+1} = \begin{bmatrix} 1 & 0 & 0 & \cdots & 0 \\ \binom{m+1}{1} & 1 & 0 & \cdots & 0 \\ \binom{m+2}{2} & \binom{m+1}{1} & 1 & \cdots & 0 \\ \vdots & \vdots & \vdots & \ddots & \vdots \\ \binom{m+n}{n} & \binom{m+n-1}{n-1} & \binom{m+n-2}{n-2} & \cdots & 1 \end{bmatrix}.$$

Given the symmetric structure of the matrix with respect to its diagonal, the matrix product of two matrices for any power is simplified in the MATPRT function (see FIG. 42) which uses in the calculations only two vectors Vn0 et Vn1 corresponding to the first columns of the two matrices, and stores the result in the vector Wn.

For example, the matrix product of the 3rd and the 31st column of Pascal's triangle is shown in rectangular form. The last number of the resulting vector Wn will be evaluated based on the matrix product between two powers of the matrix M. In this case, the number 8436 will be evaluated from the power 4 and 32 of the initial matrix whose representative vector is [1, 1, 1, 1].

MATPRT([1,4,10,20],[1,32,528,5984],3)→
    [1,36,666,8436]

The naive method in this case consists in calculating all the successive powers of M until the desired power, in the following sequence:

MATPRT([1,1,1,1,],[1,1,1,1],3)→$W_M^2$=[1,2,3,4];

MATPRT([1,1,1,1],[1,2,3,4],3)→$W_M^3$=[1,3,6,10];

MATPRT([1,1,1,1],[1,r, . . . , . . . ],3)→$W_M^P$=
    [1,1+r, . . . , . . . ].

Minimizing the number of matrix products for the sought binomial coefficient involves finding the best decomposition into a sequence of integers for the corresponding power.

The algorithmic strategy is then to calculate any binomial coefficient by a minimum number of matrix multiplications between columns. Various methods to select the columns can be used with some borrowed to fast exponentiation techniques. In fact, these ones are based on the following relation applied both to integers and square matrices.

$$a^{e=\alpha_0+\cdots+\alpha_k}=a^{\alpha_0}\cdots a^{\alpha_k}.$$

The exponent e is decomposed into a sequence of integers by means of different numeration bases or by other techniques such as Zeckendorf decomposition based on Fibonacci numbers. FIGS. 43a and 43b illustrate this principle for the matrix computation of the binomial coefficients with a binary decomposition of the exponent (FIG. 43a) or a Zeckendorf decomposition (FIG. 43b). For a binary decomposition of the exponent, only the columns $2^0$, $2^1$, $2^2$, . . . , $2^{2^k}$ will be used to perform the matrix product. Therefore, the binomial coefficient $$\binom{90}{4} = 2555190$$

will be calculated according to the following steps:
The binomial coefficient is first expressed in Pascal's triangle shown in rectangular form $$\binom{90}{4} \to \binom{90-4}{4}_R \to \binom{86}{4}_R;$$

The index of the column, starting from the 1 value, is then represented in binary form which can show the powers of 2 used in the binary decomposition.

$$86+1=87 \to \{1010111\}_2 \to \{2^6, 0, 2^4, 0, 2^2, 2^1, 2^0\};$$

A series of matrix products involving successive matrix powers is performed:

$$M^{87} = M^{64} \times M^{16} \times M^4 \times M^2 \times M^1$$

ultimately, to get the desired power of the matrix revealing the desired binomial coefficient as the last element of the first column of the matrix:

$$M^{64+16+4+2+1} = M^{87} = \begin{bmatrix} 1 & 0 & 0 & 0 & 0 \\ 87 & 1 & 0 & 0 & 0 \\ 3828 & 87 & 1 & 0 & 0 \\ 113564 & 3828 & 87 & 1 & 0 \\ 2555190 & 113564 & 3828 & 87 & 1 \end{bmatrix}.$$

The exercise can be repeated, this time using a Zeckendorf decomposition $$87 \to \{55, 21, 8, 3\}_{Zk}$$

with the gain of a matrix multiplication compared to the binary decomposition:

$$M^{87} = M^{55} \times M^{21} \times M^8 \times M^3$$

In both cases, the efficiency and minimization of the calculations involved require a simple iterative scheme for calculating powers of intermediate matrices. In general, each matrix used in the resulting matrix product will be obtained from the matrix or matrices calculated previously. An iterative scheme similar to $M_i = M_i \times M_i$ will one to calculate the matrix product on the fly for a binary decomposition, while an iterative scheme similar to $M_i = M_i \times M_{i-1}$ will be used for a Zeckendorf decomposition with powers equal to successive Fibonacci numbers.

An implementation of the simplified matrix product algorithm is shown in FIG. 42.

Calculation by Means of Factorization

It will be appreciated by the person skilled in the art that the criteria for divisibility of binomial coefficients can be exploited to find fast factorization and obtain the binomial coefficient by multiplying the factors found. For the calculation of large binomial coefficients, the best known algorithm is based on a Lucas' theorem on the prime factorization of binomial coefficients (P. Goetgheluck. Computing binomial coefficients. The American Mathematical Monthly, 94 (4):360-365, 1987.)

Position of a Number in Pascal's Triangle

The search for the position of a given number, i.e. the identification of two binomial coefficients adjacent to this number in a row or in a given column, is the foundation of the decoding techniques presented. This problem is indeterminate when the row or column is not specified because there may be several identical entries in Pascal's triangle. If n is the number of a known column, this involves finding for a certain value $y_0$ and $y=0$, the positive root of a polynomial function given by the following equation:

$$y = y_0 - \frac{(m+1)(m+2) \ldots (m+n)}{n!}.$$

In this form, the graph of the function is translated to obtain the location of the root on the y-axis. FIG. 44 illustrates the search for the position of number 20 in the fourth column of Pascal's triangle for a graph of the function this time without translation. The graph result shows that the abscissa intersection of the ordinate line 20 with the curve lies between the values 2 and 3. The number 20 is consequently located between the binomial coefficients $$\binom{4+2}{4} = 15 \text{ and } \binom{4+3}{4} = 35.$$

The Naive Method

The naive method is the application of the iterative formula $$C_r(m, n) = \begin{cases} C_y(m, n) & \text{if } m > n \\ C_y(n, m) & \text{if } m \leq n \end{cases}$$

with a stopping test when the value of the binomial coefficient calculated exceeds the value of the input data.

Elements in a column are therefore iteratively visited until the discovery of a binomial coefficient greater than the given number. If the theoretical complexity is linear, the estimate of the computational costs for completion of calculation must take into account the operations of addition, multiplication and exact division for the large integers.

Spigot Algorithm

Some types of diophantine equations have the common property of having a single root with a value greater than one, and being continuously differentiable. An algorithm to find this root is proposed concerning any kind of diophantine equation of the form $y_0 = P(x)$ where $P(x)$ is a polynomial with nonnegative integer coefficients and which has one positive root. Among the specific equations that meet these criteria are, in particular, the following equations:

$$P_m(x) = x(x+k \cdot 1) \ldots (x+k(m-1)), S_m(x) = 1^m + 2^m + \ldots + (x-1)^m.$$

When $k=1$, $P_m(x)$ is found in many problems related to the existence of exact powers which are equal to a series of consecutive integers and at the heart of the Erdös-Selfridge theorem (P. Kirschenhofer A T. Pintér, R F Tichy Yu, F. Bilu, B. Brindza and A. Schinzel. Diophantine Equations and Bernouilli Polynomials Compositio Mathematica, 131 (2): ... 173-188 2002). When $k=0$, $P_m(x)$ comes down to the classic exponential equation and finding integer nth roots, the equation $S_m(x)$ is related to Bernoulli numbers.

Principles

The principle is to improve the naive method described previously by searching first quickly the number of digits of the positive root of the Diophantine equation, then calculating one after the other missing digits. The searching of the number of digits is done by calculating the sign of the function for successive powers of 10 of the variable x. The order of convergence is therefore automatically adjusted to the degree of the function. The missing digits require no more than 10 times the number of digits of the root function and evaluations.

FIG. 45 illustrates an implementation of the ENCDEC spigot algorithm.

Noting that the index returned by ENCDEC(1,x) is 0, it is obtained, for example ENCDEC(496,5)→+6, and in general it is verified that the position of the central binomial coefficient follows the identity:

$$\text{ENCDEC}(\text{Comb}(x,x),x) \to x.$$

On the other hand, by substituting the function Comb into the function NUMFCT(x,n,0) (algorithm in FIG. 46) in the ENCDEC and DIGBIN functions, and considering NUMFCT(x, n, 0), it is possible to perform the extraction of the integer nth root of x, using the generalization of the ENCDEC function to find solutions of certain Diophantine families of equations.

Analytical Methods Analytical methods for n=1, 2, 3, 4 may be useful, depending on the performance of the extraction of integer square and cube roots. This is the case for example in two dimensions, for the reverse function of the Cantor pairing function $$I_{K_2} = \frac{(x+y)*(x+y+1)}{2} + y$$

which determines the coordinates of a point identified by its index. Let the equation $$y_0 - \frac{(m+1)*(m+2)}{2!} = 0,$$

we first search for the positive real value of $$m_0 = \frac{-3 + \sqrt{(1+8y_0)}}{2}$$

that indicates between which of the diagonals in the Cantor pattern the desired point is found. The integer part of $m_0$ which is equal to the index of the diagonal preceding the desired point, allows establishing the following correspondences with the equation $$I_{K_2} = \frac{(x+y)*(x+y+1)}{2} + y,$$

and to determine the coordinates of the given point:

$$y = y_0 - \frac{(\lfloor m_0 \rfloor + 1)*(\lfloor m_0 \rfloor + 2)}{2!};$$
$$x = \lfloor m_0 \rfloor + 1 - y.$$

The point with the index 11 will give a value of $\lfloor m_0 \rfloor = 3$ for the coordinates [3,1]. The analytical formulas for values n=3, 4 will be illustrated below in the methods of binomial decomposition of a number.

Numeric Method

The convergence of computing the position of a point can be significantly accelerated by finding the roots of the binomial function using an iterative scheme with the successive derivatives of the function. An algorithm of Newton-Raphson type whose principles could be extended to algorithms of Householder types, having higher orders of convergence is presented below. Regardless of the selected algorithm, it must be designed for integer calculation and adapt to a function of any degree. For this, a recursive algorithm for calculating the k-th derivative of the function is determined which calculates the value of the derivative function, without having to use pre-calculations to solve symbolic expressions.

The recursive expression for the k-th derivative of the binomial function $$\binom{m+n}{m}$$

is:

$$n! f_{(n)}^{(k)} = \begin{cases} 0 & \text{if } n < 0 \text{ or } k < 0 \\ 1 & \text{if } n = 1 \text{ and } k = 1 \\ f_{(n-1)}^{(k)}(m+n) + k f_{(n-1)}^{(k-1)} & \text{otherwise} \end{cases}.$$

FIG. 47 illustrates an implementation of an algorithm for recursive calculation of the kth derivative DRVREC.

$$!f(m) = (m+1)(m+2)\ldots(m+7)$$

$$\text{DRVREC}(7,3) \to 210m^4 + 3360m^3 + 19320m^2 + 47040m + 40614$$

FIG. 48 shows an implementation for degree n of an algorithm based upon Newton-Raphson methods.

$$\text{DRVSYM}(4) \to$$
$$x - \frac{((x+1)(x+2)(x+3)(x+4) - 24y_0)}{(((2x+3)(x+3) + (x+1)(x+2))(x+4) + (x+1)(x+2)(x+3))}$$

Pyramidal Representation of Integers

Using calculation functions allowing to locate any integer in a given column of Pascal's triangle, it is possible to perform the general function of decoding an integer into the Pascal representation. The decoding of a number in the quaternary representation, being a frequent operation which is essential in the compression process of general lists of integers, a purely analytical decoding will be described first, by using the principles discussed above. In this case, a sequential decoding is obtained where the successive binomial coefficients $\beta_{3,\ldots,0}$ are calculated from positive integer roots of the equation $$y = y_0 - \frac{(m+1)(m+2)\ldots(m+n)}{n!}$$

for the degrees 4, . . . , 1 of the variable m.

In an analogous manner to the two dimensions, with the index of the diagonal preceding the point corresponding to the given number, those integer values represent the index of the hyperplane, plane, line and diagonal point preceding the desired point.

$$\beta_0 = \binom{1+(y-1)}{1}$$

$$\beta_1 = \binom{2 + \left\lfloor \left(\frac{3}{2} + \frac{1}{2}\sqrt{1+8y}\right) \right\rfloor}{2}$$

$$\beta_2 = \binom{3 + \left\lfloor \left(\frac{1}{3}P^{\frac{1}{3}} + \frac{1}{P^{\frac{1}{3}}} - 2\right) \right\rfloor}{3}, P = 81y + 3\sqrt{-3 + 729y^2}$$

$$\beta_3 = \binom{4 + \left\lfloor \left(\frac{-5}{2} + \frac{1}{2}\sqrt{5 + 4\sqrt{1+24y}}\right) \right\rfloor}{4}$$

In the previous example where the combinatorial code was 1118, the decoding will be done in the following sequence:

$$\beta_3(y) = \beta_3(1118) = \binom{4+10}{4} = 1001$$

$$\beta_2(y) = \beta_2(1118 - 1001) = \binom{3+6}{3} = 84$$

$$\beta_1(y) = \beta_1(1118 - 1001 - 84) = \binom{2+6}{2} = 28$$

$$\beta_0(y) = \beta_0(1118 - 1001 - 84 - 28) = \binom{1+4}{1} = 5$$

The vector [(4+1),(6+1),(6+1),(10+1)] is then multiplied by the matrix X2N, to restore the original code[5:2:0:4].

If the spigot method is used, the BINRP4 function as illustrated in FIG. 49, will be first defined as the finding the position of any integer in the column 4, and then decrements the number from the found index, to determine the position of this new number in the column 3, this process being continued until the first column can be reached. The indices found are equivalent to 4-dimensional affine Cantor coordinates. For the previous example, BINRP4(1118)→{5, 7, 7, 11}, corresponds to the vector previously obtained by the analytical method. Similarly, the quaternary binomial representation of the number 100 will be $\{100\}_{bin}^4 = (0, 4, 4, 5)$ and its quaternary decomposition will be $$\left\{ \binom{0}{1}, \binom{5}{2}, \binom{6}{3}, \binom{8}{4} \right\}$$

that is $\{100\}_{Bin}^4 = \{0, 10, 20, 70\}$.

FIG. 49 illustrates an implementation of an algorithm for combinatorial decomposing BINRP4 of a quaternary number.

It will then be possible to extend the function BINRP4 to n-ary decomposition of a number to obtain the general function BINRPN and its reverse function RPNBIN that recompose a number given from Pascal form to a decimal form.

FIG. 50 illustrates an implementation of an algorithm (BINRPNi) for an n-ary pyramidal representation.

For example BINRPNi(125,5)→{4, 4, 4, 4, 4} thus $\{125\}_{bin}^5 = \{4, 4, 4, 4, 4\}$, and reciprocally RPNBINi([4, 4, 4, 4, 4], 5)→125.

Moreover, given the equivalences demonstrated above, it is possible to replace the functionality of lexicographic decoding (ORDLEX( )) by:

$$ORDLEX([x, m, n]) \equiv \overline{[n, \ldots, n]}^m - BINRPNi(x, m).$$

Finally, it is possible to obtain the functions of encoding and decoding for the combinatorial numeration system in 4.4.1, by substituting a by a+ind in the two lines of BINRPNi and Comb(vn[n−i+1]−1,i) by Comb(n−vn[m+1−i]−i,i) in RPNBINi.

Algorithmic Optimizations

The person skilled in the art will appreciate that elimination of inner loops is the first level of algorithmic optimization. The basic principle is to replace a double loop which calls the function to calculate a binomial coefficient by a single loop in which the binomial coefficient is calculated iteratively.

Implementation in the Case of a General List of Integers

Principle of Combinatorial Compression

Some different encoding types are presented which, according to the diagram disclosed before, allow the encoding of any list of integers via a single integer, the total index or by a triplet consisting of the local index of the list, its total degree and its length. The total index corresponds to the absolute numbering of a projective point representing the list to encode in the projective hyperspace. The person skilled in the art will appreciate that this algorithm is very efficient but quickly generates very large integers. Following the demonstrated equivalences between Numeric encoding and Cantor coding, it is also possible to choose an alternative strategy by encoding the triplet {X, m, n} in a single integer to ensure the bijective correspondence for encoding/decoding. It will be possible to do so using, for example, a three-dimensional Cantor coding, or a two-dimensional Cantor coding with two successive iterations. The implicit knowledge of the particular encoding method chosen will allow to perform the decoding. Another method is to replace number X by its two-dimensional Cantor coordinates $m_X, n_X$ and then to encode the quadruplet $\{m_X, n_X, m, n\}$ with a four-dimensional Cantor coding. By replacing the triplet by a quadruplet, there will be a limited expansion effect of the generated code size: the length of the list for coding is simply incremented by one, but a significant compression, due to the lowering of total degree of the list to be coded. Let indeed a total weight of the triplet of $$\frac{(m_X + n_X) * (m_X n_X + 1)}{2} + m_X + m + n,$$

by expressing X in terms of its Cantor coordinates, the total degree of the quadruplet will be lowered to $m_X + n_X + m + n$.

FIG. 51 illustrates an implementation of an algorithm for the optimization of the global coding (GLOBALo) and local coding (LOCALo).

FIG. 52 illustrates an implementation of an algorithm for numeric decoding (ORDNUMo and ORINUMo).

FIG. 53 illustrates an implementation of an algorithm for coding and decoding in compressed mode (INDCOM).

By taking again an example which is already being used in the case 4.1, the projective point [69, 78, 73, 71, 77, 65] of degree equal to 433, of dimension equal to 5, the following indices are obtained:

$$I_{Num}=\{55014101437\}_{(433,5)}$$

$$I_{Tot}=\{1419606883389857208104148062281258856159455782592418086487285545274686109596480318996466895925319463985864300012238628776356963859010\}_z$$

and in compressed mode, $$I_{Com}=\text{INDCOM}([69,78,73,71,77,65],5)\rightarrow\{507098669008328947049\}_C.$$

Representation of Lists of Lists

The recursive application of the function INDCOM allows encoding lists of lists. Given $L_0, L_1, \ldots, L_n$ a set of lists of integers of respective dimensions $n_0, n_1, \ldots, n_n$, a coding of first level will be defined as:

$$\text{INDCOM}([\text{INDCOM}(L_0,n_0),\text{INDCOM}(L_1,n_1), \ldots, \text{INDCOM}(L_n,n_n)],n).$$

The Representation of Integers

Besides the representation of the integers by spiral pairing functions, it is possible to consider the theoretical representation of signed integers, by means of pair representation. This approach leads particularly to double the length of the initial vector by preceding each integer by an integer indicating the sign and by extension its type. It is possible, for example, to use the 0 convention for a positive integer, 1 for a negative integer, 2 for an irrational, 3 for an imaginary, etc. The list $\{-1,2,7,-3,5\}$ will be encoded in an interlaced form $\{1, 1, 0, 2, 0, 7, 1, 3, 0, 5\}$ and with a compressed index of $\{6592155939510\}_C$.

The person skilled in the art will appreciate that signed integers can be encoded by means of a list of integers. In such a case, a list of signed integers is encoded by means of a list of unsigned integers.

Alphabetical Sort

The numeric order allows creating dictionaries with alphanumeric sorting. For this, the principle is to transform all dictionary words into codewords of identical lengths and weights. The words to be sorted alphabetically will be associated with projective points of the same lattice. The length will be the one of the longest word, and the weight, the one of the heaviest word. To sort, for example, the words: ART, ARA, BRAS, ARABE, ARABIC, ARABICA, encoded with an alphabet of 26 letters, the index of each letter corresponding to its position in the alphabet, the following points which correspond to them on the lattice $T_{40,7}$, will be sorted. The maximum length will be inherited from the word ARABICA and the maximum weight from the word BRAS.

$$\text{ART}\rightarrow[1,18,20,0,0,0,0,1]\rightarrow\{45609855\}_{I_{num}};$$

$$\text{ARA}\rightarrow[1,18,1,0,0,0,0,20]\rightarrow\{45662979\}_{I_{num}};$$

$$\text{BRAS}\rightarrow[2,18,1,19,0,0,0,0]\rightarrow\{38531317\}_{I_{num}};$$

$$\text{ARABE}\rightarrow[1,18,1,2,5,0,0,13]\rightarrow\{45658898\}_{I_{num}};$$

$$\text{ARABICA}\rightarrow[1,18,1,2,9,3,1,5]\rightarrow\{45658530\}_{I_{num}}.$$

By reversing the sorting, so that the descending order of the numeric coding is respected, the following alphabetically sorted sequence will be obtained:

$$\langle 45662979,45658898,45658898,45658530,45609855,38531317\rangle\rightarrow\langle\text{ARA,ARABE,ARABICA,ART,BRAS}\rangle.$$

Hashing

It will be appreciated by the person skilled in the art that the indexing functions described above can be advantageously used as hash functions in the same manner as the classical polynomial hash function built from the equation:

$$H(x)=(\alpha_0\cdot B^k+\alpha_1\cdot B^{k-1}+\ldots+\alpha_k\cdot B^0)\bmod N.$$

In this case, B will be commonly taken equal to a power of 2, for example equal to 256 and N equal to a prime number. By the same way, by pairing combinatorial indexing functions to the modulo operator, the following values will be obtained from the previous sequence. The choice of N may cause collision cases and a hash table fill rate more or less important.

$$\langle 15662979,45658898,45658530,45609855,38531317\rangle\rightarrow\langle 11,12,8,5,6\rangle$$

Applications for Polynomials
Literal Representation

To represent the polynomial in the form of a character string has certain advantages, especially for preserving the initial representation of the polynomial in factored form, or by preserving its type of notation, for example in reverse Polish notation. In return, the subsequent algorithmic processing of the polynomial must pass through a simple classical compilation process of arithmetic expression type. A basic encoding, character by character, can therefore be obtained from a reduced alphabet like $\{0, 1, 2, 3, 4, 5, 6, 7, 8, 9, x, +, -, *, /, '(,), \#\}$ this one being made up of digits, arithmetic operators, parentheses, the variable x and the sharp character used as a separator. The alphabet will be extended to letters of the alphabet if the polynomial is designed for symbolic processing. A numeric code being assigned to each symbol of the alphabet, the table of equivalence of the alphabet with n characters will simply be a list of integers n+1. Consequently, the maximum weight of this list will be $(n+1)^2$ The following example shows the homogeneous equation of a torus of radii a and b centered at the origin of the Euclidean frame:

$$\text{Tore}=(x_0^2+x_1^2+x_2^2-(b^2-a^2)*x_3^2)-4*a^2*(x_0^2+x_1^2)*x_3^2.$$

The list of 56 integers with a total degree of 3789, representing the torus equation in the UNICODE encoding system is:

$$L_{Tore}=\{40,120,48,94,50,43,120,49,94,50,43,120,50,\\94,50,45,40,98,94,50,45,97,94,50,41,42,120,51,\\94,50,41,94,50,45,52,42,97,94,50,42,40,120,48,\\94,50,43,120,49,94,50,41,42,120,51,94,\\50\}_{(Unicode)}.$$

The numeric encoding of $L_{Tore}$ is performed by $\text{NUMORD}(L_{Tore},56-1)$ which produces a numeric local index:

$$I_{Num}=\{43049865424991594367802378012550962768849420931362077564740744794736889204295402592251903551063043291931247050023162038956 65\}_{(3789,55)}.$$

Structured Representation

The problems of algorithmic performances are narrowly related to the chosen representations, and the memory problems are partly caused by losses due to hollow polynomials.

The vector L, representing numerical expansion of the torus polynomial for the radii a=2 and b=1, permits visualization of the different problems related to the vectoral representation: the order of coefficients corresponding the chosen order on the monomials, the presence of nul coefficients specific to hollow polynomials, and finally the management of coefficient signs that escape coding of integers greater than zero.

$$L=[1,0,2,0,1,0,0,0,0,2,0,2,0,0,1,0,0,0,0,0,0,0,0,0,$$
$$0,-10,0,-10,0,0,6,0,$$

After coding the negative values of the vector L, the numerical code of the new vector interlaced interlaced from the torus is:

$$I_{Num}= \{19143865180361749932587381 3948513\}_{(46,69)}$$

In order to overcome this type of problem, and considering that the null coefficients influence only the dimension of the vector to be coded and not its degree, it is possible to adopt an addressing strategy in cascading sequence. A hashing table without collisions having a dimension equal to the number of coefficients Cm(m,n) is created for a polynomial having a degree m in n dimension. This table contains the addresses, coded as integers, on information specific to the monomials. This information, stored separately, can be therefore the signed Numeric values of the coefficients, but also pointers to functions of symbolic calculation of the coefficients, or the indices of relational databases to establish geometric constraints between different polynomials (CADCAM variational).

$$T_0=[k_0,0,k_2,0,k_4,0,0,0,0,k_9,0,k_{11},0,0,k_{14},0,0,0,0,0,0,0,$$
$$0,0,0,k_{25},0,k_{27},0,0,k_{30},0,0,0,k_{34}]$$

Coding Vectors and Hollow Polynomials

The encoding of hollow vectors can be achieved in several different ways. The most common method is called representation "rank-and-value" described by Lehmer (D. H. Lehmer. The machine tools of combinatorics. In E. F. Beckenbach, editor, Applied Combinatorial Mathematics, pages 5-31. Wiley, New York 1964). In this case, the encoding is performed by a series of pairs of integers indicating the rank et the value of each integer in the entire hollow list. A zero is placed at the end of the list to signify the end of the message. The previous table T0 is coded as follows:

$$T_{00}= \langle 0,k_0,2,k_2,4,k_4,9,k_9,11,k_{11},14,k_{14},25,k_{25},27,k_{27},$$
$$30,k_{30},34,k_{34},0 \rangle .$$

The positions of non-zero values can be encoded separately using for example the technique of combinatorial compression. Thus, there will be the compressed code for storing the locations of non-zero values of T0:

$$\langle 35,0,2,4,9,11,14,25,27,30,34 \rangle \rightarrow$$
$$\{18369970970136995781 76773581776\}_C.$$

It is also possible to use the Pascal coding for the descending sequences, but by storing separately the vector length:

$$\langle 34,30,27,25,14,11,9,4,2,0 \rangle \rightarrow \{148139661\}_{Pas}$$

Symbolic Product of Multivariate Polynomials

The fast indexing functions of monomials that allow to process the product of two multivariate polynomials by means of the direct indexing of vectors must then be used. The MPLNUM algorithm, illustrated in FIG. 54, uses the numeric indexing algorithm by multiplying each monomial of the first polynomial by each polynomial of the second, in what has come to be known as the naive algorithm for the multiplication of two polynomials. One of the advantages of the presented algorithm is that it can be easily extended to multiplication of hollow vectors.

The symbolic algorithm for the multiplication of two multivariate polynomials is based on the basic operation of the product of two monomials, on the indexing the resulting monomial and on the summing the monomials of the same rank. The MPLNUM function performs the symbolic product of two polynomials in a given dimension. The degree of the resulting polynomial dgr calculated in line 1 and the numbers of monomials of the two multiplied polynomials as well as of the resulting polynomial are calculated from line 2 to line 9. The reset of all the terms of the resulting vector to zero is carried out at the line 10. A loop is made on the number lga of monomials of the polynomial named A, at line 11 and on the number lgb of monomials of the polynomial named B, at the line 12.

The signatures in numeric order of the two polynomials A and B are obtained at the lines 13 and 14. The multiplication of the monomials is performed by adding the signatures siga and sigb at the line 15. The index for the resulting monomial is calculated at the line 16. Finally, the resulting monomials of the same rank are summed and accumulated in the vector associated with the resulting polynomials at the line 17.

The following example illustrates the multiplication in the two-dimension projective plane of a second-degree curve (conic) by a first-degree curve (line), which gives a curve of the third degree (a degenerate cubic). Let y2a the conic curve equation $y2a=a_0x_0^2+a_1x_0x_1+a_2x_1^2+a_3x_0x_2+a_4x_1x_2+a_5x_2^2$ and yb1 the straight line equation $vb1=b_0x_0+b_1x_1+b_2x_2$, the $$10 = \binom{5}{3}$$

coefficients $\langle 0, 0, 3 \rangle , \langle 0,1,2 \rangle , \ldots , \langle 3, 0, 0 \rangle$ of the cubic curve y3c are obtained in the numeric order, MPLNUM([a0,a1,a2,a3,a4,a5],[b0,b1,b2],2,1,2)→
[a0*b0,a0*b1+a1*b0,a1*b1+a2*b0,a2*
b1,a0*b2+a3*b0,a1*b2+a3*b1+a4*b0,a2*
b2+a4*b1,a3*b2+a5*b0,a4*b2+a5*b1,a5*b2].

Implementation of the Method Disclosed

It will be appreciated by the person skilled in the art that the method as disclosed above to encode the information as well as the method to decode the information encoded by the method disclosed above may be implemented in various ways.

In particular, these methods can be implemented for example in a computer 300 as shown in FIG. 30. Computer 300 may include, for example, a processor 310, a data bus 312, a data storage unit 314, a communication port 316, a display unit 318 and a keyboard 320.

In this example, the processor 310 is adapted to process instructions. The person skilled in the art will appreciate that various types of processors can be used to perform the processing of instructions.

The data storage unit 314 is configured to store data. The person skilled in the art will appreciate that various types of storage devices can be used to provide such storage.

The communication port 316 is used to exchange information between the computer 300 and another processing unit not shown in FIG. 30. The person skilled in the art will appreciate that the communication port 316 depends on the type of connection used between the computer 300 and the other processing unit.

The display unit 318 is used for displaying data to a user. The person skilled in the art will appreciate that various types of display unit can be used.

The keyboard 320 is used to allow a user to input data into the computer 300. Again, the person skilled in the art will appreciate that various types of keyboards can be used.

It will be understood that the processor 310, the data storage unit 314, the communication port 316, the 318 display and keyboard unit 320 are operatively connected together via data bus 312.

In fact and in one embodiment, the storage unit 314 comprises an operating system 322. The operating system 322 may be of different types.

The storage unit 314 further comprises a program 324 which can be executed by the processor 310 and whose execution allows encoding the information. It will be appreciated by the person skilled in the art that a program whose execution will decode information can also be stored in the storage unit 314.

The program for encoding the information comprises instructions for obtaining a list of integers to be encoded. It will be appreciated that the list of integers to be encoded may be obtained in various ways. In one embodiment, the entire list will be input by a user via the keyboard 320. In another embodiment the entire list will be obtained from a file read out of the storage unit 314 or received through the communication port 316.

The program for encoding the information further comprises instructions for determining a hyper-pyramid having a dimension adapted to encode the entire list, the hyper-pyramid having a plurality of vertices whose number is determined by the degree of the hyper-pyramid, which is equal to the sum of the integers of the list of integers, and by the dimension of the hyper-pyramid that is equal to the number of integers in the list of integers minus one.

The program for encoding the information comprises instructions to index the list of integers in this pyramid by means of an indexing system. As mentioned before, different systems may be used for indexing.

The program for encoding the information includes instructions for providing an indication of indexing the list of integers in the hyper-pyramid in order to thereby encode said integers in the list. It will be appreciated that the indication of indexing of the list of integers in the hyper-pyramid may be provided in various ways. For example, an indication of indexing the list of integers can be displayed on the display unit 318 (e.g., a screen). Alternatively, the indication of indexing the list of integers can be stored in a file in the storage unit 314 or it can be transmitted via the communication port 316 to another processing unit.

It will be appreciated that a storage device may be provided for storing a set of instructions executable by a processor to perform a method for encoding information. The method comprising obtaining a list of integers to encode; determine a hyper-pyramid having a dimension adapted to encode the list of integers, the hyper-pyramid having a plurality of vertices whose number is determined by the degree of the hyper-pyramid, which is equal to the sum of the integers of the list of integers, and by the dimension of the hyper-pyramid which is equal to the number of integers in the list minus one; indexing the list of integers in this pyramid through an indexing system; and providing an indication of indexing the list of integers in the hyper-pyramid in order to thereby encode said integers of the list.

The invention claimed is:

1. A computer-implemented method for encoding information, the method comprising:
   obtaining, by a processor, a list of integers to be encoded;
   determining, by the processor, a hyper-pyramid having a dimension adapted to encode the list of integers, the hyper-pyramid having a plurality of vertices whose number is determined by the degree of the hyper-pyramid, which is equal to the sum of the integers in the list of integers, and by the dimension of the hyper-pyramid which is equal to the number of integers in the list minus one;
   indexing, by the processor, the list of integers in the hyper-pyramid using an indexing system; and
   providing, by the processor, an indication of the indexing of the list of integers in the hyper-pyramid.

2. The computer-implemented method of claim 1, further comprising:
   providing, by the processor, a list of alphanumeric codes; and
   transforming, by the processor, the list of alphanumeric codes into the list of integers to encode.

3. The computer-implemented method of claim 1, wherein the indexing system allows an indexing of each vertex of the plurality of vertices of said hyper-pyramid.

4. The computer-implemented method of claim 1, wherein the indication of the indexing of the list of integers in the hyper-pyramid comprises an integer representing the index of the projective point in the indexing system, m being the total degree of said list of integers and n being the number of integers in the list of integers.

5. The computer-implemented method of claim 4, further comprising converting, by the processor, the integer representing the projective point in the indexing system into combinatorial coordinates mx and nx.

6. The computer-implemented method of claim 4, further comprising processing, by the processor, m, the total degree of the list of integers, and n, the number of integers in the list of integers into an integer Y representing an overall index.

7. The computer-implemented method of claim 6, further comprising summing, by the processor, the integer Y representing an overall index with the integer representing the index of the projective point, in order to provide a total index Z, the indication of the indexing of the hyper-pyramid comprising the total index Z.

8. The computer-implemented method of claim 1, wherein the list of integers is obtained from a file.

9. The computer-implemented method of claim 1, wherein the step of providing the indication of the indexing in the hyper-pyramid comprises storing, by the processor, said indication of the indexing in a file.

10. The computer-implemented method of claim 1, wherein the step of providing the indication of the indexing of the list of integers in the hyper-pyramid comprises transmitting, by the processor, the indication of the indexing of the list of integers to a second processor via a network.

11. The computer-implemented method of claim 1 further comprising
   providing, by the processor, a list of integers; and
   generating, by the processor, the list of whole numbers using the list of integers.

12. The computer-implemented method of claim 1, wherein providing the indication of the indexing of the list of integers in the hyper-pyramid comprises displaying said indication of the indexing on a display.

13. The use of the computer-implemented method of claim 1 to compress a string of characters associated with said list of integers.

14. A computer-implemented method for coding a list of lists, the method comprising an iterative use of the computer-implemented method as claimed in claim 1 for coding a list of lists.

15. The use of the computer-implemented method of claim 1 to encrypt a list of integers, wherein the indexing of the list of integers corresponds to an encryption of the list of integers.

16. A computer-implemented method for decoding information encoded using the computer-implemented method for encoding the information as set forth in claim 1, the method comprising:
obtaining, by the processor, an indication of the indexing of the list of integers in the hyper-pyramid;
obtaining, by the processor, an indication of an indexing system used to generate said indication of the indexing of the list of integers in the hyper-pyramid;
determining, using the indexing system used and the indication of the indexing of the list of integers, said list of integers; and
providing, by the processor, said list of integers.

17. A computer comprising:
a display unit;
a processor;
a data storage unit comprising a program configured to be executed by the processor to encode information, the program comprising:
instructions for obtaining a list of integers to be encoded;
instructions for determining a hyper-pyramid having a dimension adapted for encoding the list of integers, the hyper-pyramid having a plurality of vertices whose number is determined by the degree of the hyper-pyramid, which is equal to the sum of the integers of the list, and by the dimension of the hyper-pyramid which is equal to the number of integers in the list of integers minus one;
instructions for indexing the list of integers in the hyper-pyramid using an indexing system; and
instructions for providing an indication of an indexing of the list of integers in the hyper-pyramid.

18. A non-transitory computer storage medium for storing programming instructions executable by a processor, which when executed will cause the execution by the processor of a method for encoding information, the method comprising:
obtaining a list of integers to be encoded;
determining a hyper-pyramid having a dimension adapted to encode the list of integers, the hyper-pyramid having a plurality of vertices whose number is determined by the degree of the hyper-pyramid, which is equal to the sum of the integers of the list of integers and by the dimension of the hyper-pyramid which is equal to the number of integers in the list of integers minus one;
indexing the list of integers in the hyper-pyramid using an indexing system; and
providing an indication of the indexing of the list of integers in the hyper-pyramid.

\* \* \* \* \*